(12) United States Patent
Nishio et al.

(10) Patent No.: US 8,683,415 B2
(45) Date of Patent: Mar. 25, 2014

(54) WIRING SUPPORT METHOD AND APPARATUS

(75) Inventors: Yoshitaka Nishio, Yokosuka (JP); Motoyuki Tanisho, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/615,735

(22) Filed: Sep. 14, 2012

(65) Prior Publication Data

US 2013/0086546 A1    Apr. 4, 2013

(30) Foreign Application Priority Data

Sep. 29, 2011 (JP) ................. 2011-214465

(51) Int. Cl.
*G06F 17/50* (2006.01)
(52) U.S. Cl.
USPC ........... 716/126; 716/100; 716/101; 716/102; 716/103; 716/104; 716/118; 716/119; 716/129; 716/130; 716/131
(58) Field of Classification Search
USPC .......... 716/100–104, 118–119, 126, 129–131
See application file for complete search history.

(56) References Cited

U.S. PATENT DOCUMENTS

| | | | | |
|---|---|---|---|---|
| 5,196,362 A | * | 3/1993 | Suzuki | 438/599 |
| 5,231,589 A | * | 7/1993 | Itoh et al. | 716/113 |
| 6,490,713 B2 | * | 12/2002 | Matsumoto | 716/129 |
| 7,143,385 B2 | | 11/2006 | Itou et al. | |
| 8,006,219 B2 | * | 8/2011 | Nishio et al. | 716/132 |

FOREIGN PATENT DOCUMENTS

| | | |
|---|---|---|
| JP | 63-031192 | 2/1988 |
| JP | 1-154531 | 6/1989 |
| JP | 7-296027 | 11/1995 |
| JP | 2004-287681 | 10/2004 |
| JP | 2006-011684 | 1/2006 |

* cited by examiner

*Primary Examiner* — Nghia Doan
(74) *Attorney, Agent, or Firm* — Fujitsu Patent Center

(57) ABSTRACT

A disclosed method includes: accepting designation of a condition of grouping plural signal lines to be wired from a user; and switching and carrying out a grouping of the plural signal lines into plural groups based on the designated condition and a disposition pattern of start terminals and end terminals of the plural signal lines. The condition may be designated from a first requirement, a second requirement and a third requirement that includes the first requirement and the second requirement and in which a priority is set to the first requirement or the second requirement.

9 Claims, 39 Drawing Sheets

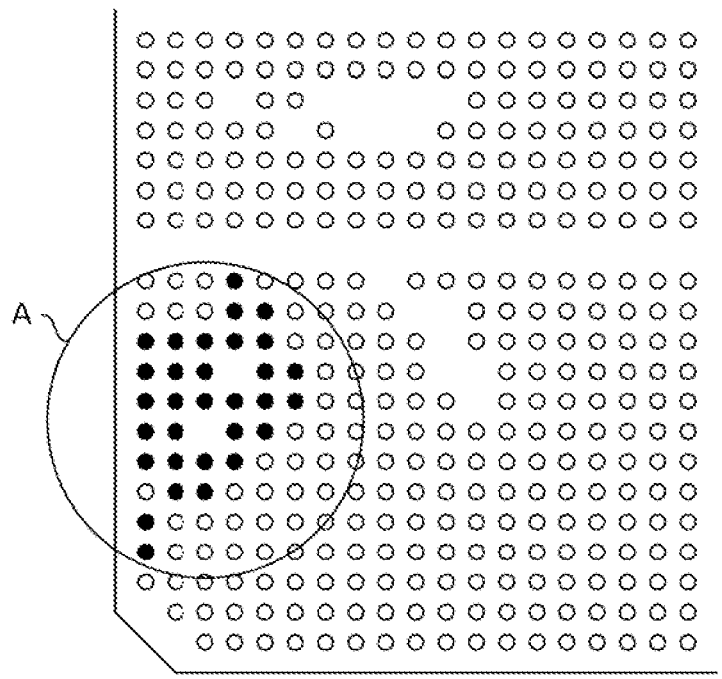
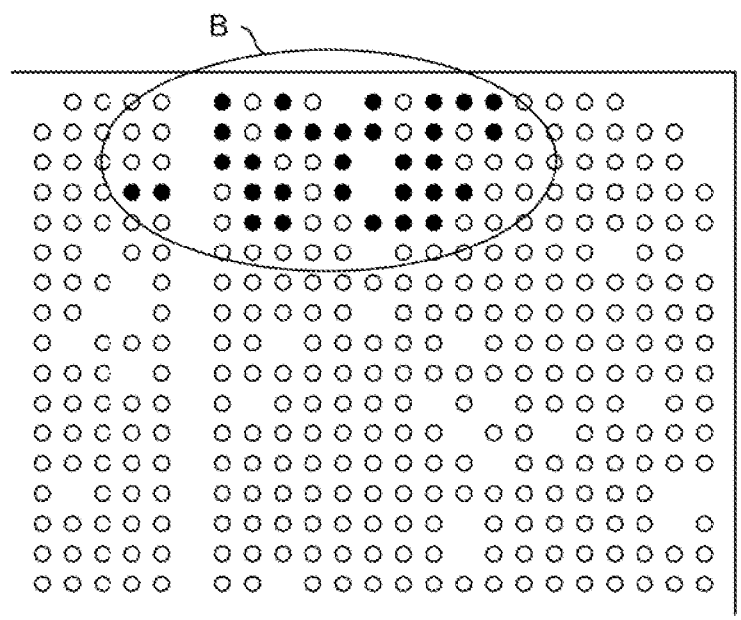
FIG.3A
RELATED ART

| SIGNAL LINE ID | GROUP NO. |
|---|---|
| 1 | 3 |
| 2 | 2 |
| 3 | 1 |
| 4 | 3 |
| 5 | 2 |
| ⋮ | ⋮ |

| Dx | Dy |
|---|---|
| 1 | 3 |
| 2 | 5 |
| 4 | 7 |
| 6 | 9 |
| 8 | 10 |
| ⋮ | ⋮ |

| SIGNAL LINE ID | CLASSIFICATION DESTINATION GROUP |
|---|---|
| 1 | NOT DETERMINED |
| 2 | NOT DETERMINED |
| 4 | NOT DETERMINED |
| 6 | NOT DETERMINED |
| 8 | NOT DETERMINED |
| ⋮ | ⋮ |

FIG.28

| SIGNAL LINE ID | CLASSIFICATION DESTINATION GROUP |
|---|---|
| 1651 | Ab |
| 1652 | NOT DETERMINED |
| 1653 | NOT DETERMINED |
| 1654 | NOT DETERMINED |
| ⋮ | ⋮ |
| 1671 | A |
| 1672 | A |
| ⋮ | ⋮ |

FIG.29

| SIGNAL LINE ID | CLASSIFICATION DESTINATION GROUP |
|---|---|
| 1651 | Ab |
| 1652 | Ab |
| 1653 | A |
| 1654 | A |
| ⋮ | ⋮ |
| 1671 | A |
| 1672 | A |
| ⋮ | ⋮ |

FIG.30

| A | Ab | Dy |
|---|---|---|
| 1653 | 1651 | 3 |
| 1654 | 1652 | 5 |
| 1671 | | 7 |
| 1672 | | 9 |
| ⋮ | | 10 |
| ⋮ | | ⋮ |

| SIGNAL LINE ID | MANHATTAN LENGTH | TARGET LENGTH | LENGTH OF TEMPORARY WIRED LINE | CLASSIFICATION DESTINATION GROUP |
|---|---|---|---|---|
| 1 | 76.000 mm | 83.600 mm | NOT DETERMINED | NOT DETERMINED |
| 4 | 75.800 mm | 83.380 mm | NOT DETERMINED | NOT DETERMINED |
| 15 | 75.700 mm | 83.270 mm | NOT DETERMINED | NOT DETERMINED |
| 7 | 74.130 mm | 71.543 mm | NOT DETERMINED | NOT DETERMINED |
| 31 | 74.000 mm | 81.400 mm | NOT DETERMINED | NOT DETERMINED |
| ... | ... | ... | ... | ... |
| 28 | 67.220 mm | 73.942 mm | NOT DETERMINED | NOT DETERMINED |

FIG.43A

| CLASSIFICATION DESTINATION GROUP | NO. OF SIGNAL LINES TO BE ALLOCATED |
|---|---|
| A | 0 |
| B | 0 |
| C | 0 |

| SIGNAL LINE ID | MANHATTAN LENGTH | TARGET LENGTH | LENGTH OF TEMPORARY WIRED LINE | CLASSIFICATION DESTINATION GROUP |
|---|---|---|---|---|
| 1 | 76.000 mm | 83.600 mm | 80.060 mm | A |
| 4 | 75.800 mm | 83.380 mm | NOT DETERMINED | NOT DETERMINED |
| ... | ... | ... | ... | ... |

FIG.46

| CLASSIFICATION DESTINATION GROUP | NO. OF SIGNAL LINES TO BE ALLOCATED |
|---|---|
| A | 1 |
| B | 0 |
| C | 0 |

FIG.47

| SIGNAL LINE ID | MANHATTAN LENGTH | TARGET LENGTH | LENGTH OF TEMPORARY WIRED LINE | CLASSIFICATION DESTINATION GROUP |
|---|---|---|---|---|
| 1 | 76.000 mm | 83.600 mm | 80.060 mm | A |
| 4 | 75.800 mm | 83.380 mm | NOT DETERMINED | NOT DETERMINED |
| 15 | 75.700 mm | 83.270 mm | NOT DETERMINED | NOT DETERMINED |
| 7 | 74.130 mm | 71.543 mm | NOT DETERMINED | NOT DETERMINED |
| 31 | 74.000 mm | 81.400 mm | NOT DETERMINED | NOT DETERMINED |
| ... | ... | ... | ... | ... |
| 28 | 67.220 mm | 73.942 mm | NOT DETERMINED | NOT DETERMINED |

| CLASSIFICATION DESTINATION GROUP | NO. OF SIGNAL LINES TO BE ALLOCATED |
|---|---|
| B | 0 |
| C | 0 |
| A | 1 |

FIG. 49

| SIGNAL LINE ID | MANHATTAN LENGTH | TARGET LENGTH | LENGTH OF TEMPORARY WIRED LINE | CLASSIFICATION DESTINATION GROUP |
|---|---|---|---|---|
| 1 | 76.000 mm | 83.600 mm | 80.060 mm | A |
| 4 | 75.800 mm | 83.380 mm | 74.900 mm | B |
| 15 | 75.700 mm | 83.270 mm | 75.000 mm | C |
| 7 | 74.130 mm | 71.543 mm | 74.252 mm | A |
| 31 | 74.000 mm | 81.400 mm | 75.105 mm | C |
| ... | ... | ... | ... | ... |
| 28 | 67.220 mm | 73.942 mm | 71.270 mm | A |

FIG. 50

| CLASSIFICATION DESTINATION GROUP | NO. OF SIGNAL LINES TO BE ALLOCATED |
|---|---|
| A | 11 |
| C | 10 |
| B | 10 |

WIRING SUPPORT METHOD AND APPARATUS

CROSS-REFERENCE TO RELATED APPLICATIONS

This application is based upon and claims the benefit of priority of the prior Japanese Patent Application No. 2011-214465, filed on Sep. 29, 2011, the entire contents of which are incorporated herein by reference.

FIELD

This technique relates to a technique for supporting the wiring of signal lines on Large Scale Integration (LSI) circuits, printed circuit boards or the like.

BACKGROUND

Recently, in the wiring design work on a multilayer board having plural layers, it is normal that the requested signal speed is increased and design constraints are designated. The design constraints may include designation of the length of the wiring path, or instruction to make the lengths of the respective wiring paths included in a group having plural wiring paths, such as bus, identical in order to match the timings of the signals flowing in signal lines between components.

For example, as illustrated in FIG. 1, when the signals have to reach at the same timing from drivers 1000 that are transmission sources of the signals to receivers 1100 that are destinations of the signals, an equal line-length condition that the lengths of all wiring paths are equal is set.

In addition, as illustrated in FIG. 2A (top view) and FIG. 2B (cross section), in case of the multilayer board, the wiring can be made by using a via 1001 from a signal terminal 1004 in a first layer L1 to a signal terminal 1003 (e.g. a terminal of a semiconductor chip IC1) in a second layer L2. However, because the respective signals delay in wired lines 1002 passing across plural layers through the via 1001, the wiring on a single layer without using the via is requested as illustrated in FIG. 2C.

However, when a lot of signals from start terminals A to end terminals B are wired on a single layer as illustrated in FIG. 3A, the wiring area becomes board due to the bypass of the wired lines as illustrated in FIG. 3B, and the difference of the length among the signal lines becomes large.

As schematically illustrated in FIG. 4A, when the wiring area 1600 is made small for the high-density packaging, the longest length of the lines to be wired from the drivers to the receivers is shortened. However, when reducing the wiring area is emphasized, a case may occur where the variation arises in the lengths of the signal lines, and it is difficult to carry out adjustment for complying with the aforementioned equal line-length condition.

On the other hand, as schematically illustrated in FIG. 4B, when the equal line-length condition is emphasized and the wiring is carried out so as to reduce the difference of the lengths of the lines, a case may occur where the longest length of the line among the lengths of the lines to be wired from the drivers to the receivers becomes long, the wiring area 1700 becomes large and the high density wiring becomes difficult, accordingly.

Therefore, it is desired that, when the signal lines to be wired are grouped to the plural layers, such problems do not occur in each layer.

However, it is often difficult to appropriately group the signal lines to be wired to plural layers, manually. More specially, an inefficient job is carried out that the grouping and subsequent tasks are redone, when it is known later that the wiring cannot be made so as to satisfy the requirements.

In addition, an automatic design technique exists in which a virtual wiring area of the signal lines is calculated, the number of signals in an area, which overlaps with another area for other signal lines, is adjusted, and some signal lines are moved to another layer. However, this conventional technique assumes other signal lines exist, and the problem on the difference of the lengths among the signal lines is not considered.

Furthermore, a method also exists, in which the signal lines are grouped by evaluating the disposition of the components and the density of the wires to search for the optimum paths by disposing the respective grouped signal lines so as to be as close as possible. However, even by this technique, there is a case where the problem concerning the lengths of the lines cannot be solved, because no constraints are considered in the grouping. Moreover, the efficiency is poor, because a procedure including reconsidering the rough paths of the grouped signal lines and evaluating the rough paths is repeated. Moreover, there is no consideration also for the efficiency improvement for the wiring area.

Furthermore, a technique exists in which intervals of plural signal lines are estimated, the plural signal lines are wired by the bundle, and when the arrangement of the output terminals is the same as that of the input terminals, the wiring is made on the same layer of the printed circuit board, and when the arrangement of the output terminals is different from that of the input terminals, the signal lines are assigned to two layers by providing a switching area in an arbitrary bending area. However, the assigning the signal lines to two layers means connecting the signal lines through the via, so the constraint is not satisfied with the aforementioned single-layer wiring.

When plural signal lines to be wired are grouped in order to carry out the single-layer wiring in plural layers, the matters to be considered are as follows: Namely, those are easiness of adjusting the lengths of the lines, which means making it easy to satisfy the equal line-length condition, and easiness of the wiring, which means making it easy to carry out the wiring without concentrating the signal lines and/or the signal terminals to reduce the wiring area. Moreover, there is a problem concerning which of them has priority when both of them are to be considered. It is impossible for the conventional arts to group the plural signal lines so as to cope with such problems.

SUMMARY

A method for classifying plural signal lines to be wired to plural groups includes: (A) accepting designation of a condition of grouping plural signal lines to be wired from a user; and (B) switching and carrying out a grouping of the plural signal lines into plural groups based on the designated condition and a disposition pattern of start terminals and end terminals of the plural signal lines.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 3A is a diagram depicting a disposition state of signal terminals before the wiring;

FIG. 28 is a diagram depicting an example of data in the second classification processing;

FIG. 29 is a diagram depicting an example of data in the second classification processing;

FIG. 30 is a diagram depicting an example of data in the second classification processing;

FIG. 43A is a diagram depicting an example of a manhattan length table;

FIG. 43B is a diagram depicting an example of a net allocation table;

FIG. 45 is a diagram depicting an example of the manhattan length table;

FIG. 46 is a diagram depicting an example of the net allocation table;

FIG. 47 is a diagram depicting an example of the manhattan length table;

FIG. 48 is a diagram depicting an example of the net allocation table;

FIG. 49 is a diagram depicting an example of the manhattan length table;

FIG. 50 is a diagram depicting an example of the net allocation table; and

DESCRIPTION OF EMBODIMENTS

Figure 5:
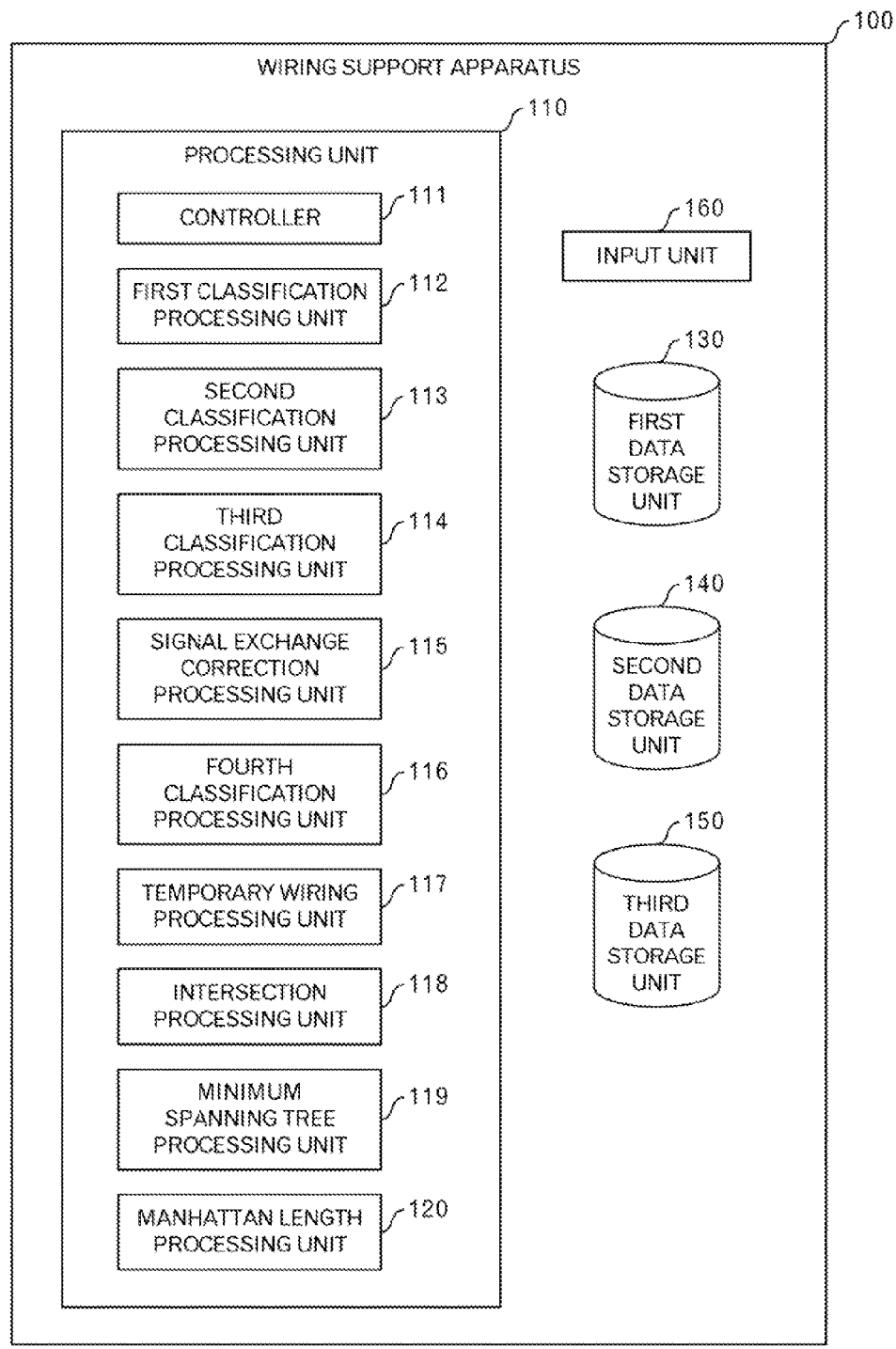
FIG. 5 is a functional block diagram of a wiring support apparatus in an embodiment.

FIG. 5 illustrates a functional block diagram of a wiring support apparatus 100 relating to an embodiment of this technique. The wiring support apparatus 100 has a processing unit 110, first data storage unit 130 storing data of signal lines to be processed and the like, second data storage unit 140 storing data generated intermediately in the processing of the processing unit 110, third data storage unit 150 storing processing results of the processing unit 110, and input unit 160 that accepts instructions from a user.

In addition, the processing unit 110 includes a controller 111, first classification processing unit 112 that carries out a circle search uniformly classifying processing, second classification processing unit 113 that carries out a minimum spanning tree uniformly classifying processing, third classification processing unit 114 that carries out an XY classifying processing, signal exchange correction processing unit 115, fourth classification processing unit 116 that carries out a line-length-based classifying processing, a temporary wiring processing unit 117, intersection processing unit 118, minimum spanning tree processing unit 119, and manhattan length processing unit 120.

The first data storage unit 130 stores an identifier of each signal line (also referred as net) to be wired, an identifier of a start terminal of the signal line, an identifier of an end terminal of the signal line, coordinate values of the start terminal, and coordinate values of the end terminal. The signal lines to be wired are signal lines designated, for example, by the user through the input unit 160, and data of the signal lines may be inputted through the input unit 160. Moreover, data of the signal lines to be wired may be read from another computer connected through a network, and stored into the first data storage unit 130.

Next, processing contents of the wiring support apparatus 100 will be explained using FIGS. 6 to 50.

Figure 6:
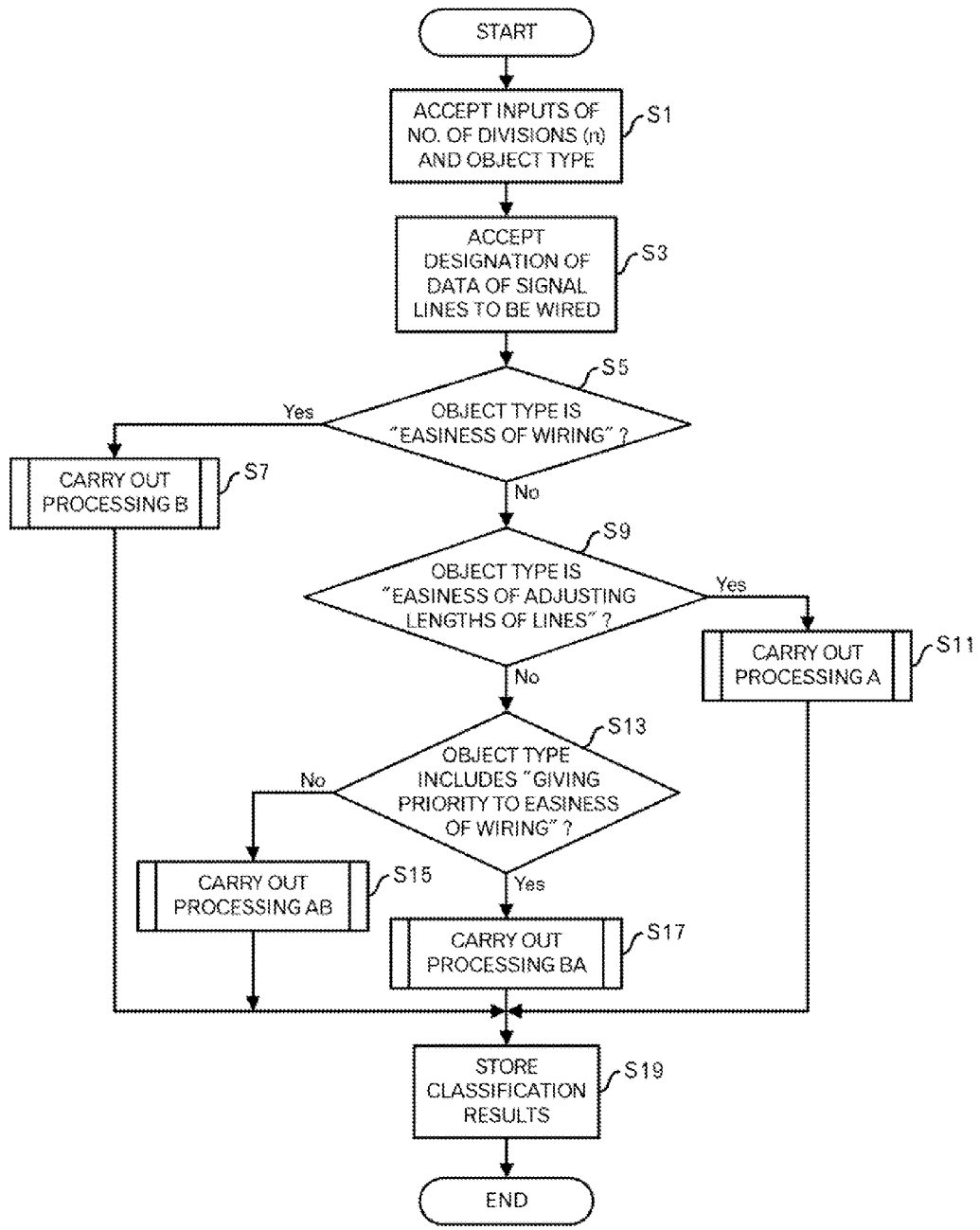
FIG. 6 is a diagram depicting a top level processing flow in this embodiment.

First, the input unit 160 prompts the user to input the number n of divisions (also referred to as the number of groups) and an object type of the grouping, accepts these data from the user, and stores accepted data into the first data storage unit 130 (FIG. 6: step S1). In this embodiment, the object type is either of A: "easiness of adjusting the lengths of lines", B: "easiness of the wiring", AB: "easiness of adjusting the lengths of lines and easiness of the wiring and giving priority to the easiness of adjusting the lengths of lines", and BA: "easiness of adjusting the lengths of lines and easiness of the wiring and giving the priority to the easiness of the wiring".

In addition, the input unit 160 prompts the user to designate data of the signal lines to be wired, accepts input data from the user, and stores the input data into the first data storage unit 130 (step S3). As described above, data such as a file may be read from the outside such as another computer, and may be stored into the first data storage unit 130.

Then, the controller 111 of the processing unit 110 reads out the object type of the wiring, which is stored in the first data storage unit 130, and determines whether or not the object type is B: "easiness of the wiring" (step S5). When the easiness of the wiring is designated as the object type, the controller 111 causes the processing units described below to carry out a processing B described below (step S7).

On the other hand, when the objective type is not "easiness of the wiring", the controller 111 determines whether or not the objective type is A: "easiness of adjusting the lengths of the lines" (step S9). When the easiness of adjusting the lengths of the lines is designated as the object type, the controller 111 causes the processing units described below to carry out a processing A described below (step S11).

Furthermore, when the object type is not the "easiness of adjusting the lengths of the lines", the controller 111 determines whether or not the object type is BA: "easiness of the wiring and easiness of adjusting the lengths of the lines, and giving priority to the easiness of the wiring" (step S13). When the object type is the "easiness of the wiring and easiness of adjusting the lengths of the lines, and giving priority to the easiness of the wiring", the controller 111 causes the processing units described below to carry out a processing BA described below (step S17).

On the other hand, when the object type is not BA: "easiness of the wiring and easiness of adjusting the lengths of the lines and giving priority to easiness of the wiring", the object type is AB: "easiness of the wiring and easiness of adjusting the lengths of lines, and giving priority to easiness of adjusting the lengths of the lines". Therefore, the controller 111 causes the processing units described below to carry out a processing AB described below (step S15).

After that, the controller 111 stores the classification results stored in the second data storage unit 140 into the third data storage unit 150 (step S19). Then, the processing ends.

Thus, the processing is firstly switched according to the object type.

Next, the processing B that is a classification processing executed when the object type is "the easiness of the wiring" will be explained by using FIG. 7 to FIG. 8D.

Figure 7:
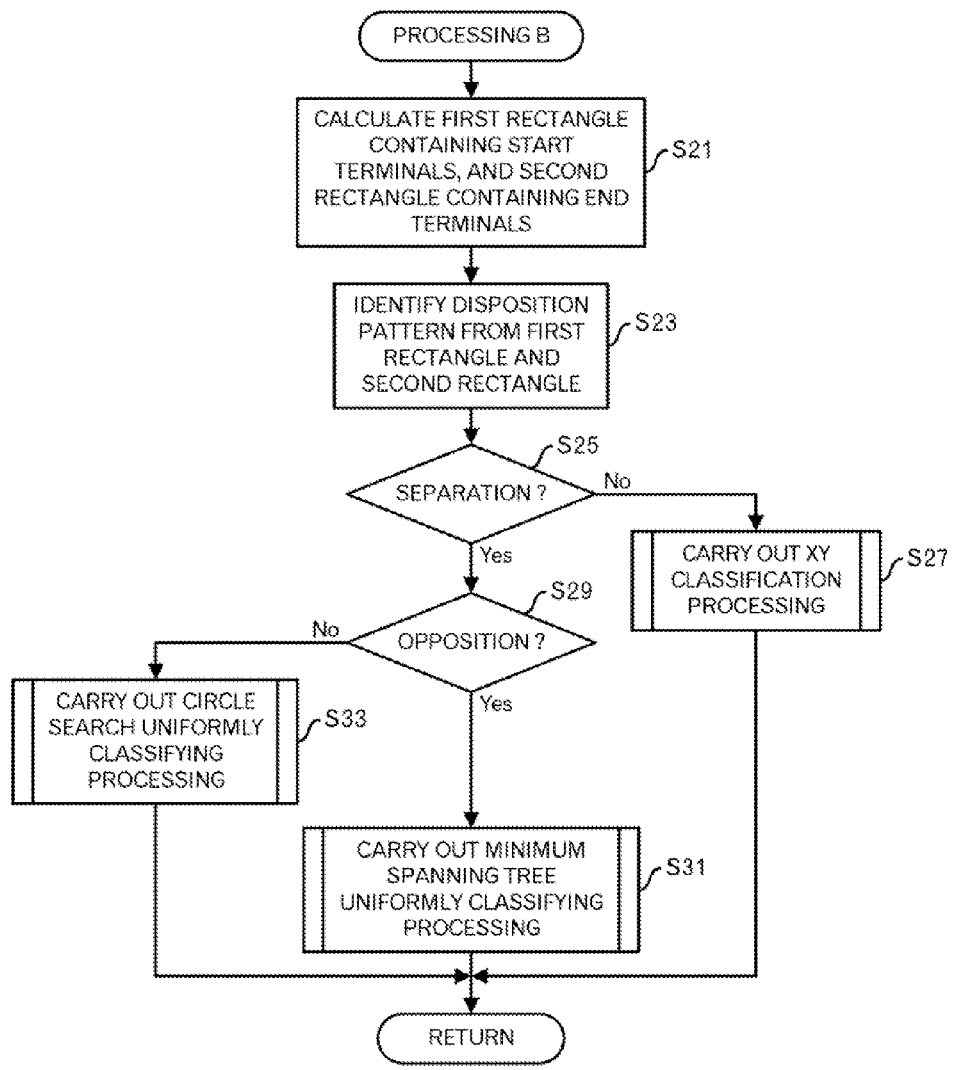
FIG. 7 is a diagram depicting a processing flow of a processing B.

The controller 111 calculates a first rectangle containing start terminals from the coordinates of the start terminals, which are stored in the first data storage unit 130, calculates a second rectangle containing end terminals from the coordinates of the end terminals, which are stored in the first data storage unit 130, and stores coordinate data of vertexes of the rectangles into the second data storage unit 140, for example (FIG. 7: step S21). Then, the controller 111 identifies a disposition pattern of the start terminals and end terminals from the first and second rectangles (step S23).

Figure 1:
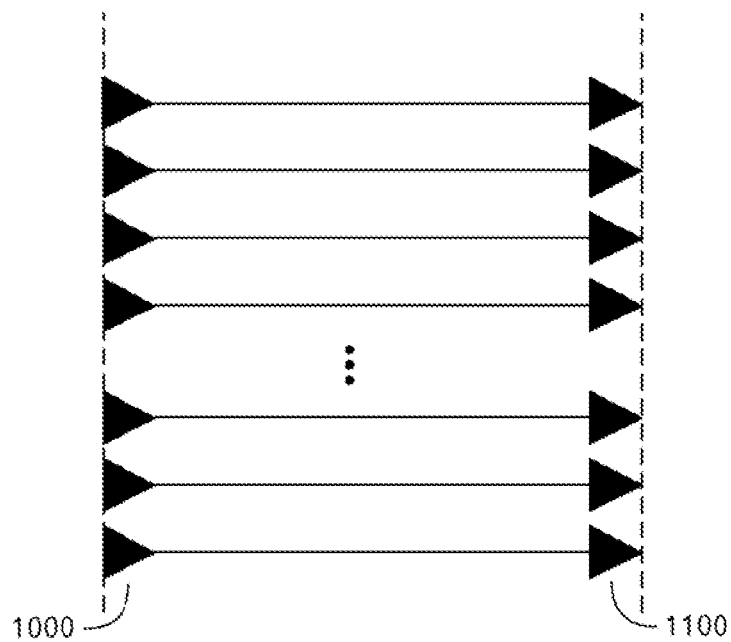
FIG. 1 is a schematic diagram to explain an equal line-length condition.
Figure 2A:
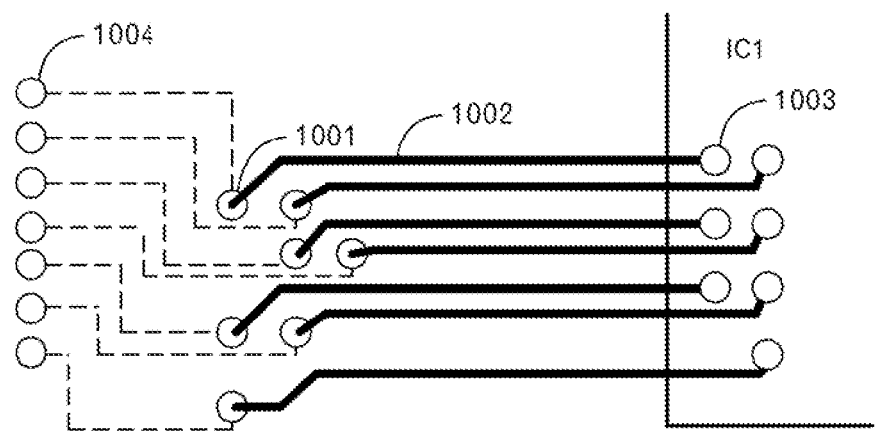
FIG. 2A is a plane diagram depicting an example of the wiring using vias.
Figure 2B:
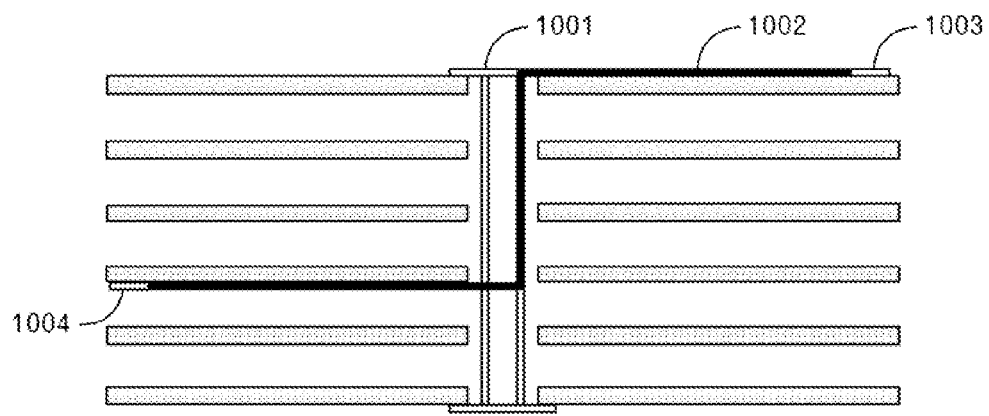
FIG. 2B is a cross section diagram depicting an example of the wiring using the vias.
Figure 2C:
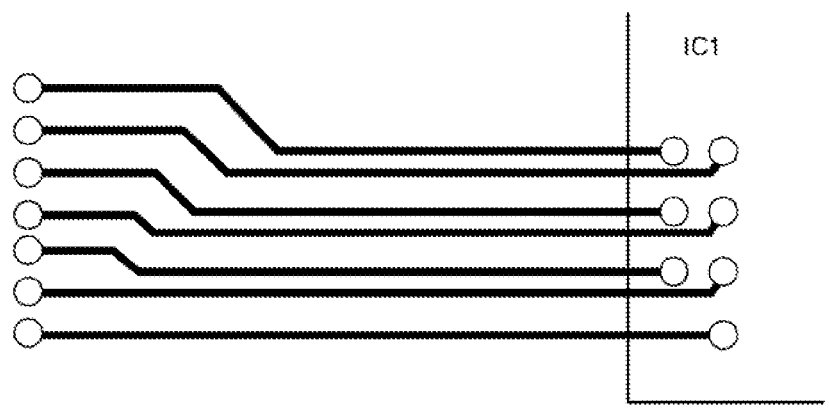
FIG. 2C is a plane diagram depicting an example of a single layer wiring.
Figure 3B:
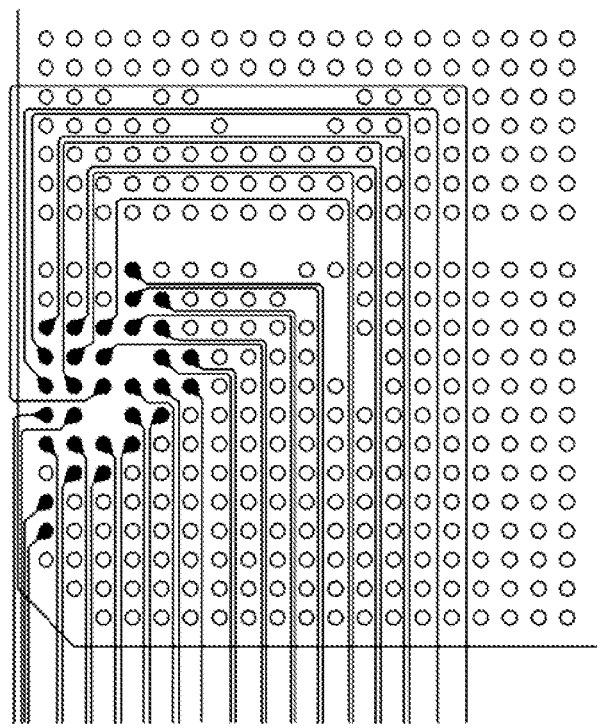
FIG. 3B is a diagram depicting a state after the wiring.
Figure 4A:
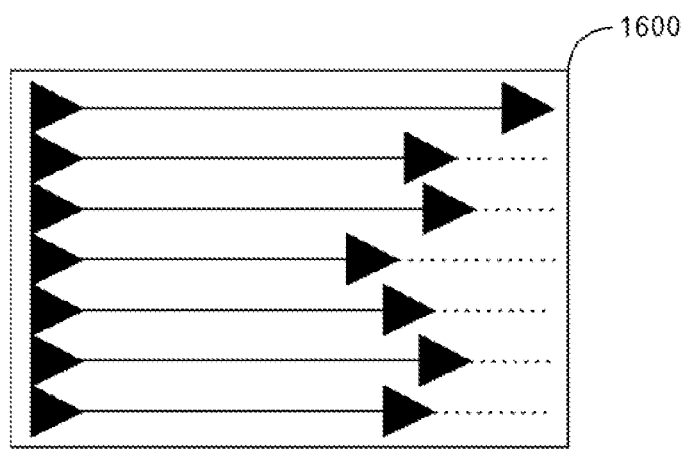
FIG. 4A is a schematic diagram depicting distribution of the lengths of the lines when a wiring area is reduced.
Figure 4B:
FIG. 4B is a schematic diagram depicting an example of the wiring area when the equal line-length condition is satisfied.
Figure 8A:
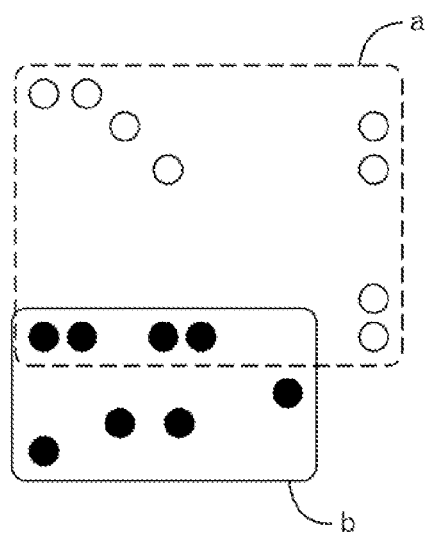
FIG. 8A is a diagram depicting an example of a disposition pattern "separation"
Figure 8B:
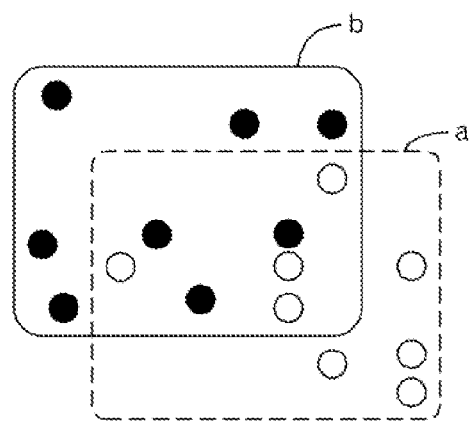
FIG. 8B is a diagram depicting an example in case where the disposition pattern "separation" is not established.

In this embodiment, as illustrated in FIG. 8A, the controller 111 determines whether or not the disposition pattern "separation" is established (step S25). In other words, it is determined whether or not either of the first rectangle "a" containing the start terminals, which are represented by white circles, and the second rectangle "b" containing the end terminals, which are represented by black circles, does not contain any opposite terminals. In the example of FIG. 8A, one or more of the end terminals, which are represented by the black circles, are included in the first rectangle "a", however, no start terminal of the start terminals, which are represented by the white circles, is not included in the second rectangle "b". Therefore, the pattern "separation" is established. On the other hand, as illustrated in FIG. 8B, one or more of the end terminals, which are represented by the black circles, are included in the first rectangle "a", and one or more of the start terminals, which are represented by the white circles, are included in the second rectangle "b". Therefore, the pattern "separation" is not established.

Figure 8C:
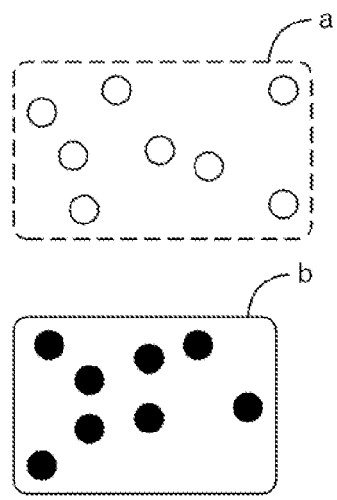
FIG. 8C is a diagram depicting an example in case where the disposition pattern "separation" is established and a disposition pattern "opposition" is also established.
Figure 8D:
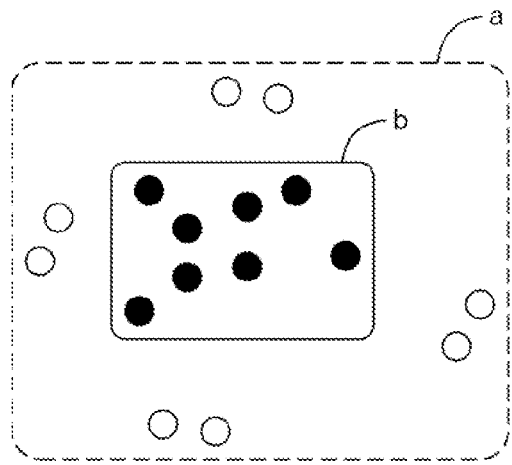
FIG. 8D is a diagram depicting an example in case where the disposition pattern "separation" is established and a disposition pattern "non-opposition" is established.

When the pattern "separation" is established, as illustrated in FIG. 8C, the controller 111 determines whether or not a disposition pattern "opposition", in which the first rectangle "a" and the second rectangle "b" do not intersect each other is established. On the other hand, as illustrated in FIG. 8D, when the first rectangle "a" and the second rectangle "b" intersect each other (in the example of FIG. 8D, the second rectangle "b" is included in the first rectangle "a".), the controller 111 determines that a disposition pattern "non-opposition", which represents it is not "opposition", is established.

When it is determined at the step S23 that the disposition pattern "separation" is not applicable (step S25: No route), the controller 111 causes the third classification processing unit 114 to carry out an XY classification processing (step S27). Then, the processing returns to the calling-source processing. The XY classification processing will be explained in detail later.

On the other hand, when it is determined at the step S23 that the disposition pattern "separation" is applicable (step S25: Yes route), the controller 111 determines whether or not it is determined at the step S23 that the disposition pattern "opposition" is applicable (step S29). When it is determined at the step S23 that the disposition pattern "opposition" is applicable, the controller 111 causes the second classification processing unit 113 to carry out a minimum spanning tree uniformly classifying processing (step S31). Then, the processing returns to the calling-source processing. The minimum spanning tree uniformly classifying processing will be explained in detail later.

On the other hand, when it is determined at the step S23 that the disposition pattern "opposition" is not applicable, the controller 111 causes the first classification processing unit 112 to carry out the circle search uniformly classifying processing (step S33). Then, the processing returns to the calling-source processing. The circle search uniformly classifying processing will be explained in detail later.

By carrying out this processing B, the signal lines are grouped so as to make it easy to carry out the wiring according to the disposition pattern of the start terminals and end terminals.

Next, the processing BA, which is the classification processing executed when the easiness of the wiring and the easiness of adjusting the lengths of the lines are to be achieved, and the easiness of the wiring has the priority, will be explained by using FIG. 9.

Figure 9:
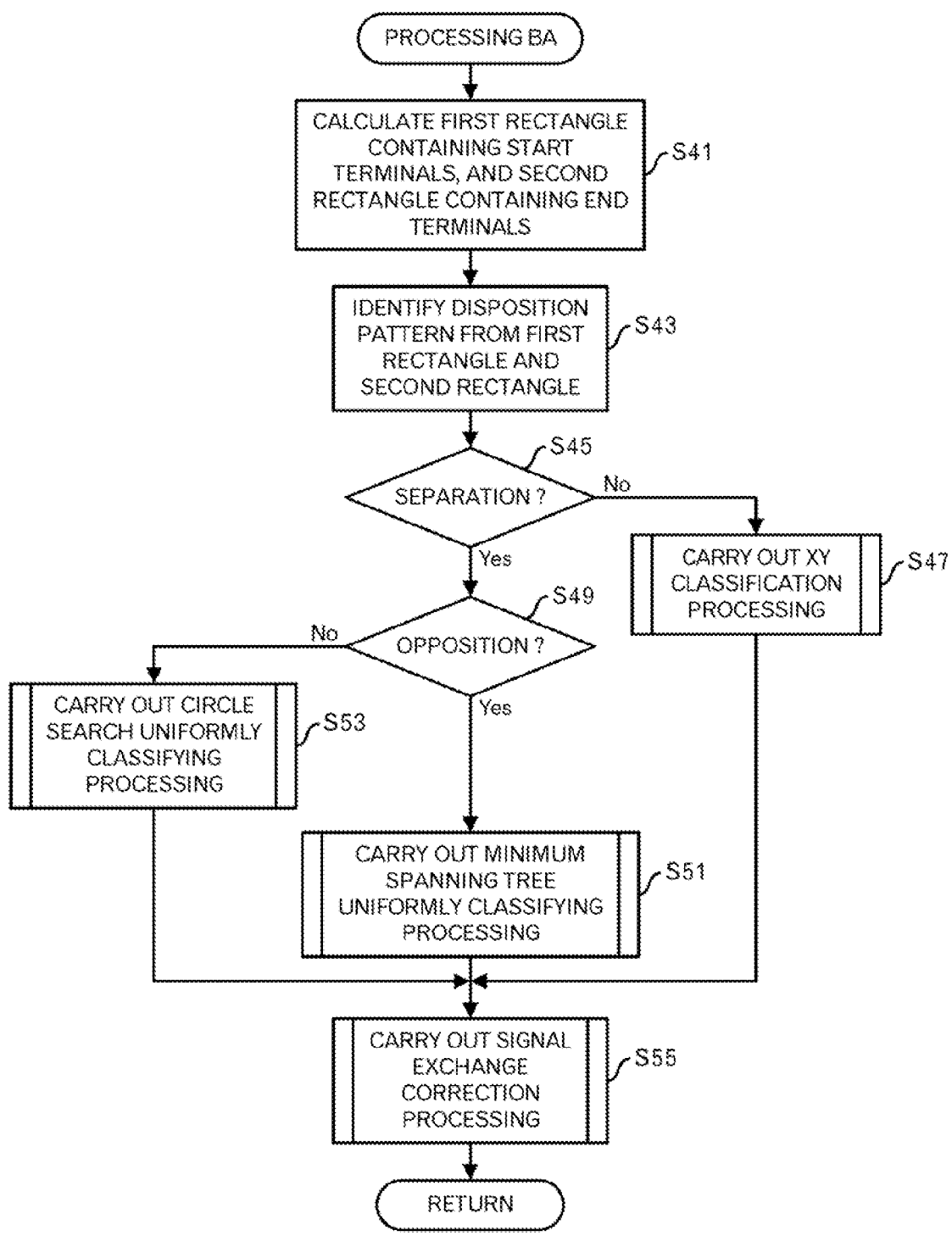
FIG. 9 is a diagram depicting a processing flow of a processing BA.

The controller 111 calculates a first rectangle containing start terminals from the coordinates of the start terminals, which are stored in the first data storage unit 130, calculates a second rectangle containing end terminals from the coordinates of the end terminals, which are stored in the first data storage unit 130, and stores coordinate data of vertexes of the rectangles into the second data storage unit 140, for example (FIG. 9: step S41). Then, the controller 111 identifies a disposition pattern of the start terminals and end terminals from the first and second rectangles (step S43). The steps S41 and S43 are the same as the steps S21 and S23.

When it is determined at the step S43 that the disposition pattern "separation" is not applicable (step S45: No route), the controller 111 causes the third classification processing unit 114 to carry out the XY classification processing (step S47). The XY classification processing will be explained in detailed later. Then, the processing shifts to step S55.

On the other hand, when it is determined at the step S43 that the disposition pattern "separation" is applicable (step S45: Yes route), the controller 111 determines whether or not it is identified at the step S43 that the disposition pattern "opposition" is applicable (step S49). When it is determined at the step S43 that the disposition pattern "opposition" is applicable, the controller 111 causes the second classification processing unit 113 to carry out the minimum spanning tree uniformly classifying processing (step S51). Then, the processing shifts to step S55. The minimum spanning tree uniformly classifying processing will be explained in detail later.

On the other hand, when it is identified at the step S43 that the disposition pattern "opposition" is not applicable, the controller 111 causes the first classification processing unit 112 to carry out the circle search uniformly classifying processing (step S53). Then, the processing shifts to the step S55. The circle search uniformly classifying processing will be explained in detail later.

The processing up to this stage is similar to that in the processing B. However, after the step S47, S51 or S53, the controller 111 causes the signal exchange correction processing unit 115 to carry out the signal exchange correction processing (step S55). Then, the processing returns to the calling-source processing. The signal exchange correction processing will be explained in detail later.

By carrying out this processing BA, similarly to the processing B, the signal lines are grouped so as to make it easy to carry out the wiring according to the disposition pattern of the start terminals and end terminals. Furthermore, because the signal exchange correction processing, which will be explained in detail later, is carried out, the maximum length of the line among the signal lines to be wired is shortened to some extent, and the line-length adjusting process to observe the equal line-length condition is simplified to some extent.

Figure 10:
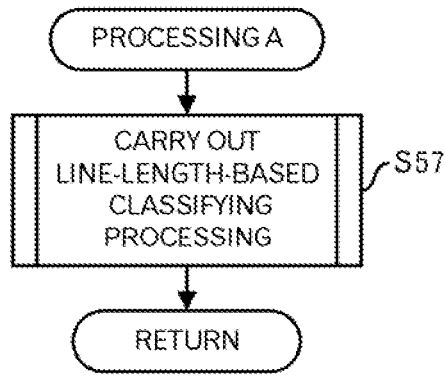
FIG. 10 is a diagram depicting a processing flow of a processing A.

Next, the processing A, which is the classification processing executed when the easiness of adjusting the lengths of the lines is to be achieved, will be explained by using FIG. 10.

The controller 111 causes the fourth classification processing unit 116 to carry out the line-length-based classifying processing (step S57). Then, the processing returns to the calling-source processing. The line-length-based classifying processing will be explained in detail later.

By carrying out such a processing, the signal lines are grouped so as to shorten the maximum length of the line for each group, as described below. In other words, the difficulty of the line-length adjusting process to observe the equal line-length condition is reduced.

Figure 11:
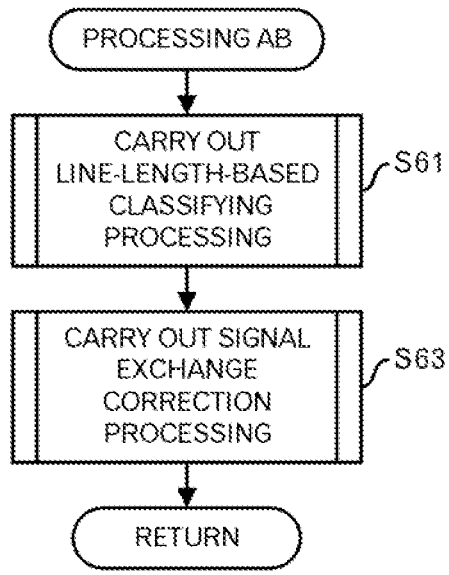
FIG. 11 is a diagram depicting a processing flow of a processing AB.

Next, the processing AB, which is the processing executed when the easiness of adjusting the lengths of the lines and easiness of the wiring are to be achieved and the easiness of adjusting the lengths of the lines has the priority, will be explained by using FIG. 11.

The controller 111 causes the fourth classification processing unit 116 to carry out the line-length-based classifying processing (step S61). The line-length-based classifying processing will be explained in detail later. After that, the controller 111 causes the signal exchange correction processing unit 115 to carry out the signal exchange correction processing (step S63). Then, the processing returns to the calling-source processing. The signal exchange correction processing will be explained in detail later.

By carrying out such a processing, the signal lines are grouped so as to shorten the maximum length of the lines in each group, as described below. In other words, the difficulty of the line-length adjusting process to observe the equal line-length condition is reduced. Furthermore, because the signal exchange correction processing described in detail later is carried out, the wiring space is secured to some extent, and the easiness of the wiring is also secured to some extent.

As described above, the signal lines are appropriately classified according to the object type designated by the user and the disposition pattern of the start terminals and end terminals of the signal lines to be wired.

Figure 12:
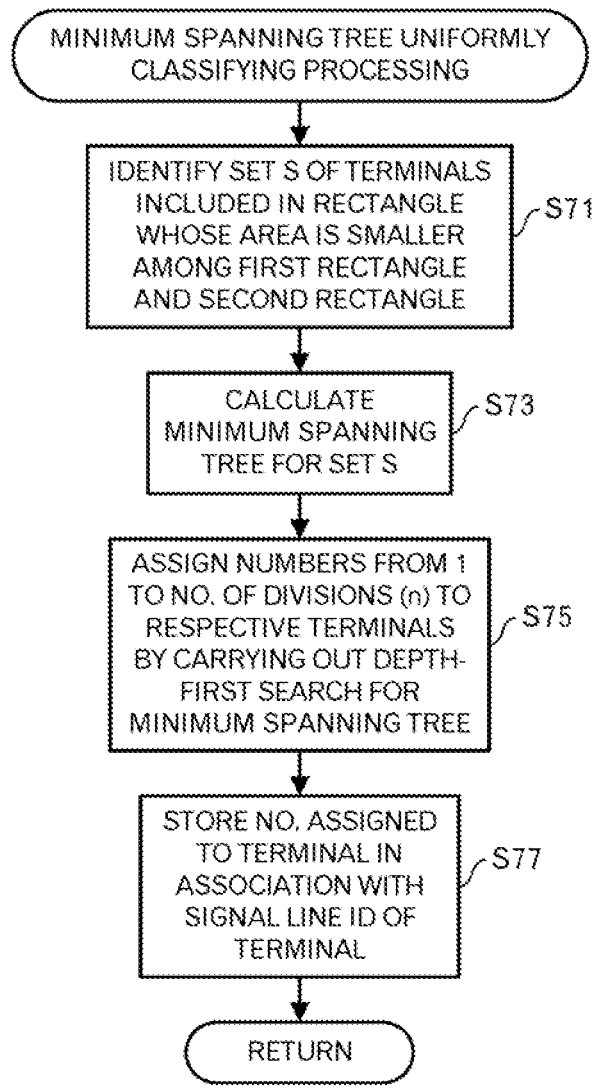
FIG. 12 is a diagram depicting a processing flow of a minimum spanning tree uniformly classifying processing.

Next, the minimum spanning tree uniformly classifying processing to group the signal lines so as to distribute the terminals in each group as uniformly as possible will be explained by using FIGS. 12 to 16. The second classification processing unit 113 compares an area of the first rectangle with an area of the second rectangle based on data stored in the second data storage unit 140, and identifies a set S of the signal terminals included in the rectangle having the smaller area (FIG. 12: step S71). More specifically, the coordinate data of the signal terminals included in the rectangle having the smaller area are read from the first data storage unit 130.

Figure 13:
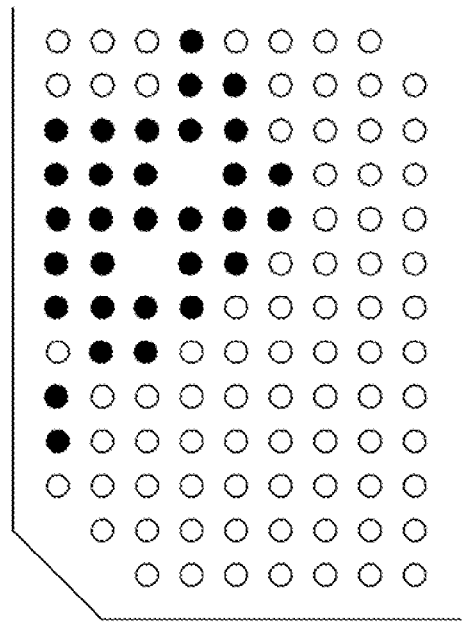
FIG. 13 is a diagram depicting an example of signal terminals.
Figure 14:
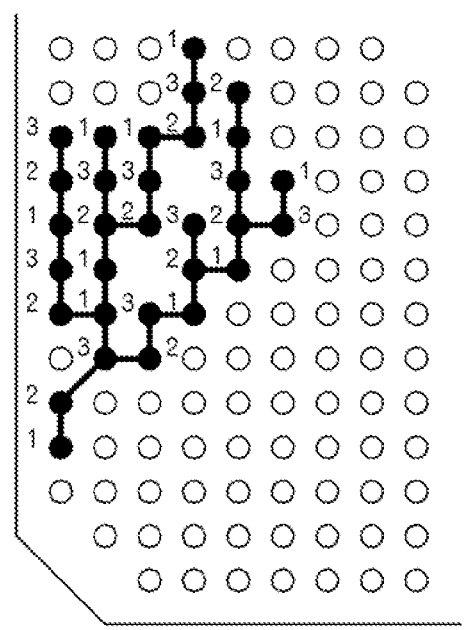
FIG. 14 is a diagram depicting an example of a minimum spanning tree.

Then, the second classification processing unit 113 causes the minimum spanning tree processing unit 119 to generate the minimum spanning tree for the set S, and stores data of the minimum spanning tree into the second data storage unit 140 (step S73). For example, when the signal terminals as illustrated by the black circles in FIG. 13 are identified as the set S, the minimum spanning tree is generated as illustrated in FIG. 14. Incidentally, the numbers illustrated in FIG. 14 are not identified at the stage of the step S73. Furthermore, the generation algorithm of the minimum spanning tree is well-known, so the detailed explanation is omitted.

Next, the second classification processing unit 113 (or the minimum spanning tree processing unit 119) assigns the number up to the number n of divisions to each signal terminal by carrying out the depth-first search for the generated minimum spanning tree (step S75). The depth-first search is well-known, so the further explanation is omitted. When the depth-first search is carried out, the number from "1" to "n", which is equal to the number of divisions, is assigned to each signal terminal as illustrated in FIG. 14. This number corresponds to the group number.

Figures 15, 16A:
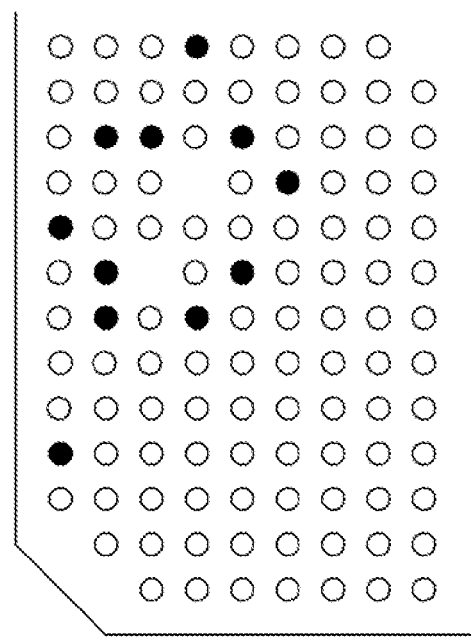
FIG. 15 is a diagram depicting an example of a classification result.
FIG. 16A is a diagram depicting an example of terminals in group 1.

Then, the second classification processing unit 113 identifies signal line identifiers of the terminals included in the set S from the first data storage unit 130, and stores the number assigned at the step S75 to the signal terminal into the third data storage unit 150 in association with the identified identifiers of the signal terminal (step S77). For example, data as illustrated in FIG. 15 is stored. In an example of FIG. 15, the group number is stored in association with the identifier of the signal line.

Figure 16B:
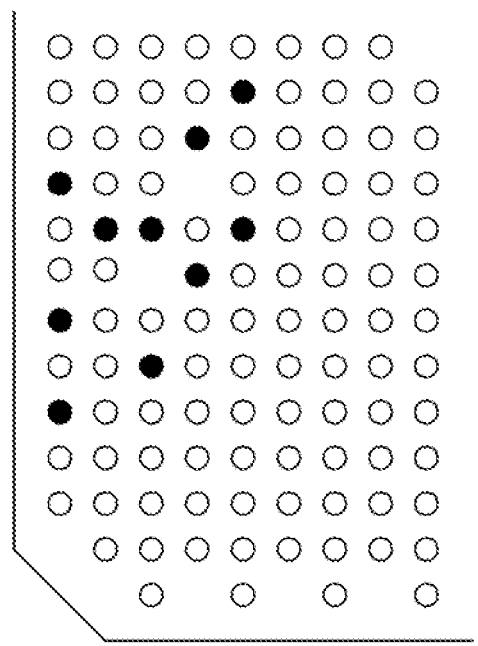
FIG. 16B is a diagram depicting an example of terminals in group 2.
Figure 16C:
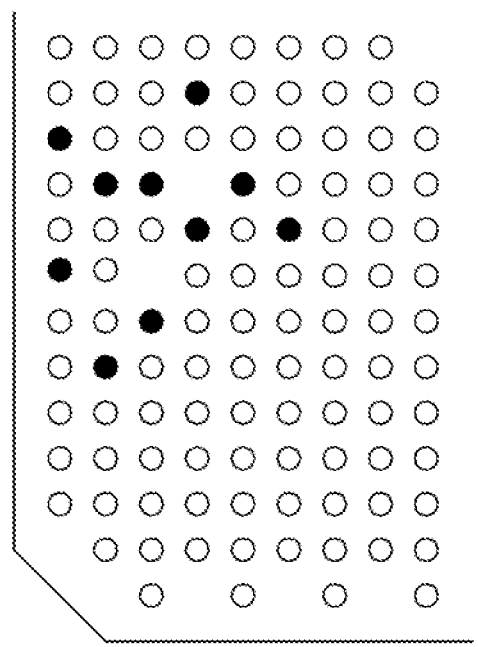
FIG. 16C is a diagram depicting an example of terminals in group 3.

As illustrated in FIG. 14, when the number is assigned according to the depth-first search, different numbers are assigned to the signal terminals, which are relatively adjacent each other. Therefore, the grouping is carried out so that the terminal positions are almost uniformly dispersed. In other words, the easiness of the wiring is ensured. In the example of FIG. 13, FIG. 16A depicts a group whose number is "1", FIG. 16B depicts a group whose number is "2", and FIG. 16C depicts a group whose number is "3". Thus, it can be understood that the terminal positions are almost uniformly dispersed.

Incidentally, instead of the depth-first search, the breadth-first search or the lowest-layer breadth-first search may be adopted.

Next, the circle search uniformly classifying processing that is a second processing for carrying out the grouping so that the terminals of each group are uniformly distributed will be explained by using FIGS. 17 to 19.

Figure 17:
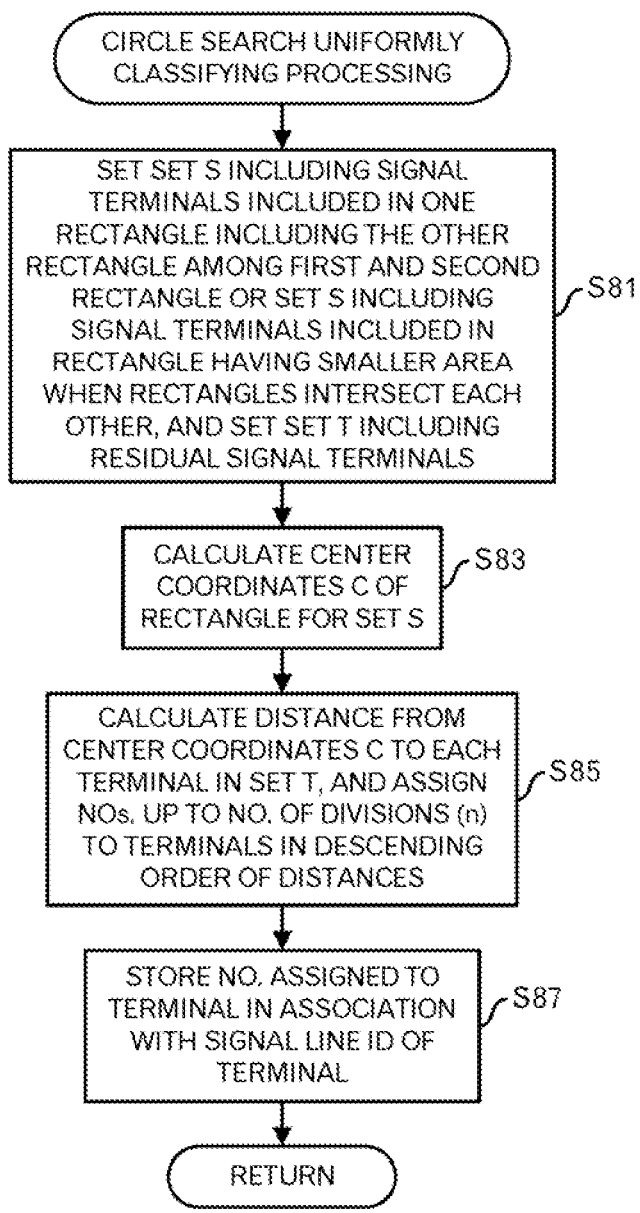
FIG. 17 is a diagram depicting a processing flow of a circle search uniformly classifying processing.

The first classification processing unit 112 sets, based on data of the rectangles, which are stored in the second data storage unit 140, a set S including signal terminals included in one rectangle including the other rectangle among the first and second rectangles or a set S including signal terminals included in a rectangle having the smaller area when the rectangles intersect each other, and sets a set T including the residual signal terminals (FIG. 17: step S81). More specifically, the first classification processing unit 112 reads data of the signal terminals in the set S from the first data storage unit 130, and reads data of the signal terminals in the set T from the first data storage unit 130.

Figure 18:
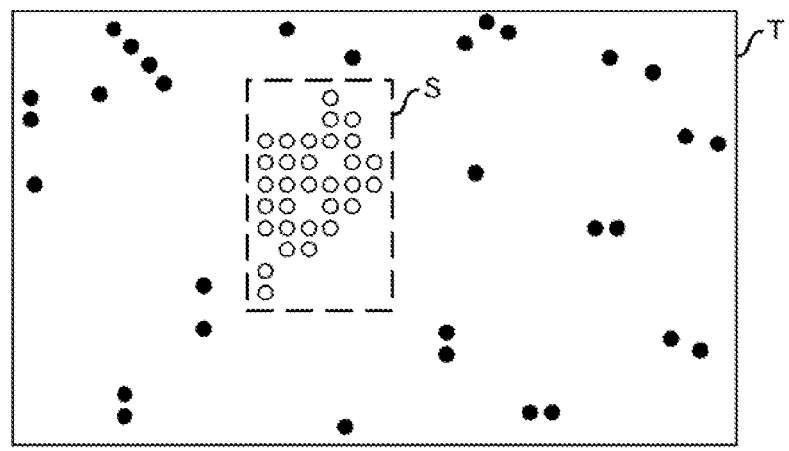
FIG. 18 is a diagram depicting an example of a set S and set T.

As illustrated in FIG. 18, when the rectangle for the start terminals depicted by the white circles is contained in the rectangle for the end terminals depicted by the black circles, the start terminals are set as the set S and the end terminals are set as the set T.

Then, the first classification processing unit 112 calculates coordinates of a center of the rectangle for the set S, and stores the center coordinates C into the second data storage unit 140 (step S83). In the example of FIG. 18, the center coordinates of the rectangle S are calculated. Then, the first classification processing unit 112 calculates a distance from the center coordinates C to each signal terminal in the set T, and assigns a number to each signal terminal in descending order of the distance (step S85).

Figure 19:
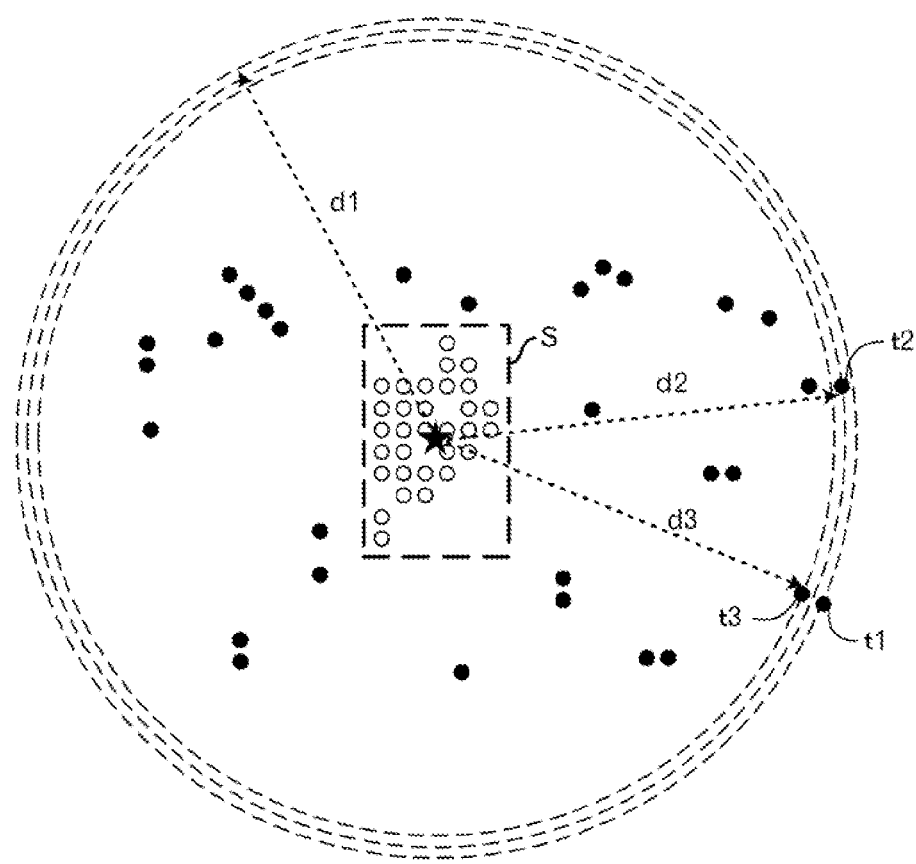
FIG. 19 is a diagram to explain the grouping in the circle search uniformly classifying processing.

In the example of FIG. 18, as illustrated in FIG. 19, the numbers from "1" to "n", which is equal to the number of divisions, are assigned in order of the signal terminal t1 whose distance to the center (star mark) of the rectangle S is the maximum, the signal terminal t2 whose distance to the center is second, and the signal terminal t3 whose distance to the center is third. In other words, "1" is assigned to "t1", "2" is assigned to "t2", and "3" is assigned to "t3".

After that, the first classification processing unit 112 identifies the identifiers of the signal lines of the terminals included in the set T from the first data storage unit 130, and stores the numbers assigned at the step S85 to the signal terminals in the third data storage unit 150 in association with the identified identifiers of the signal terminals (step S87). For example, data as illustrated in FIG. 15 is stored.

Thus, by grouping the signal terminals in descending order of the distances from the center of the rectangle whose area is smaller among the first and second rectangles so that the signal terminals are uniformly dispersed, the signal lines are grouped. Accordingly, in the disposition pattern in which they are separated as illustrated in FIG. 8D but not opposed, it becomes possible to carry out the grouping so that the signal terminals are uniformly dispersed.

Next, the XY classification processing that is a processing to ensure the easiness of the wiring by reducing the intersections of the segments connecting the start terminals with the end terminals in the same group will be explained by using FIGS. 20 to 33.

Figure 20:
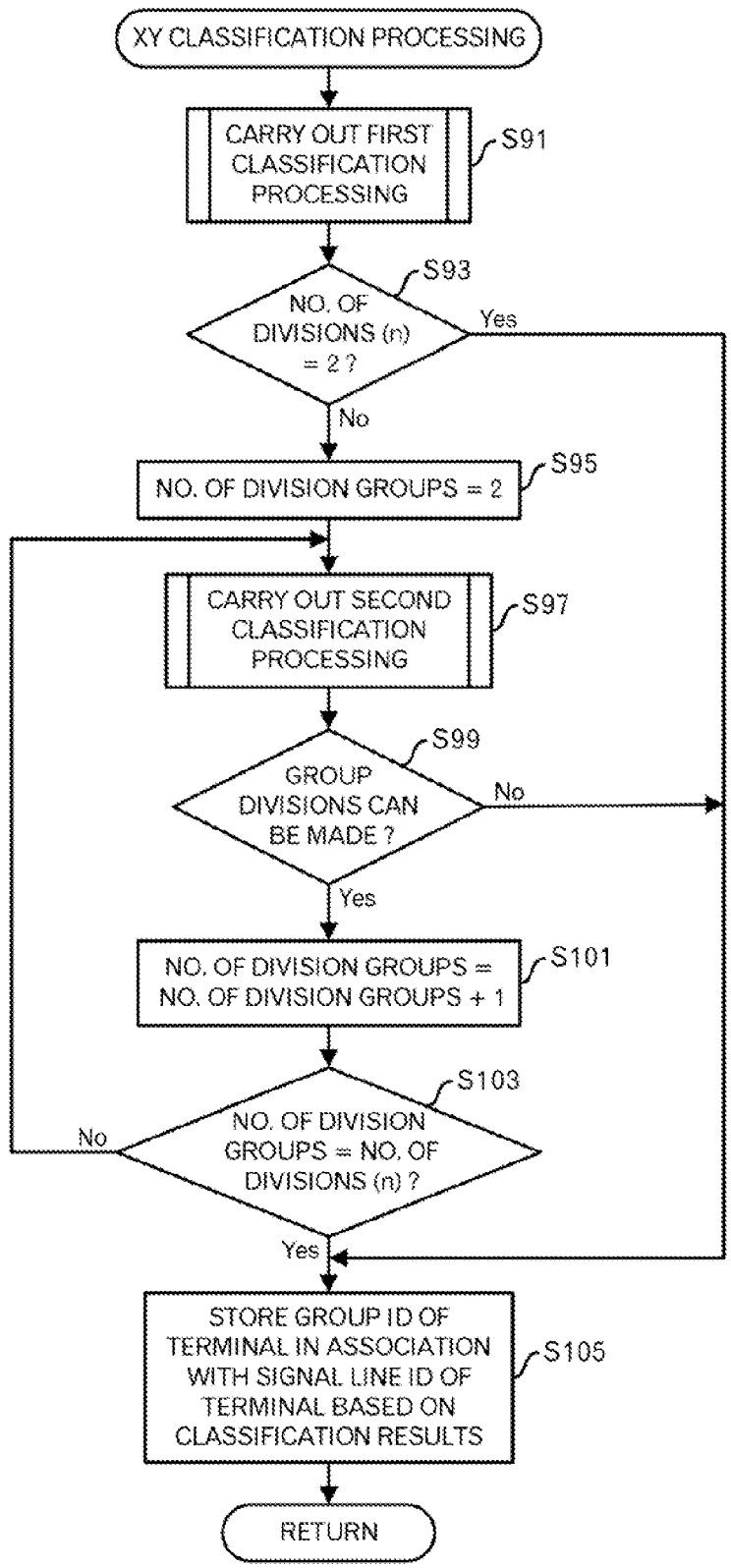
FIG. 20 is a diagram depicting a processing flow of an XY classifying processing.

First, the third classification processing unit 114 carries out the first classification processing (FIG. 20: step S91). The first classification processing will be explained by using FIGS. 21 to 25C.

Figure 21:
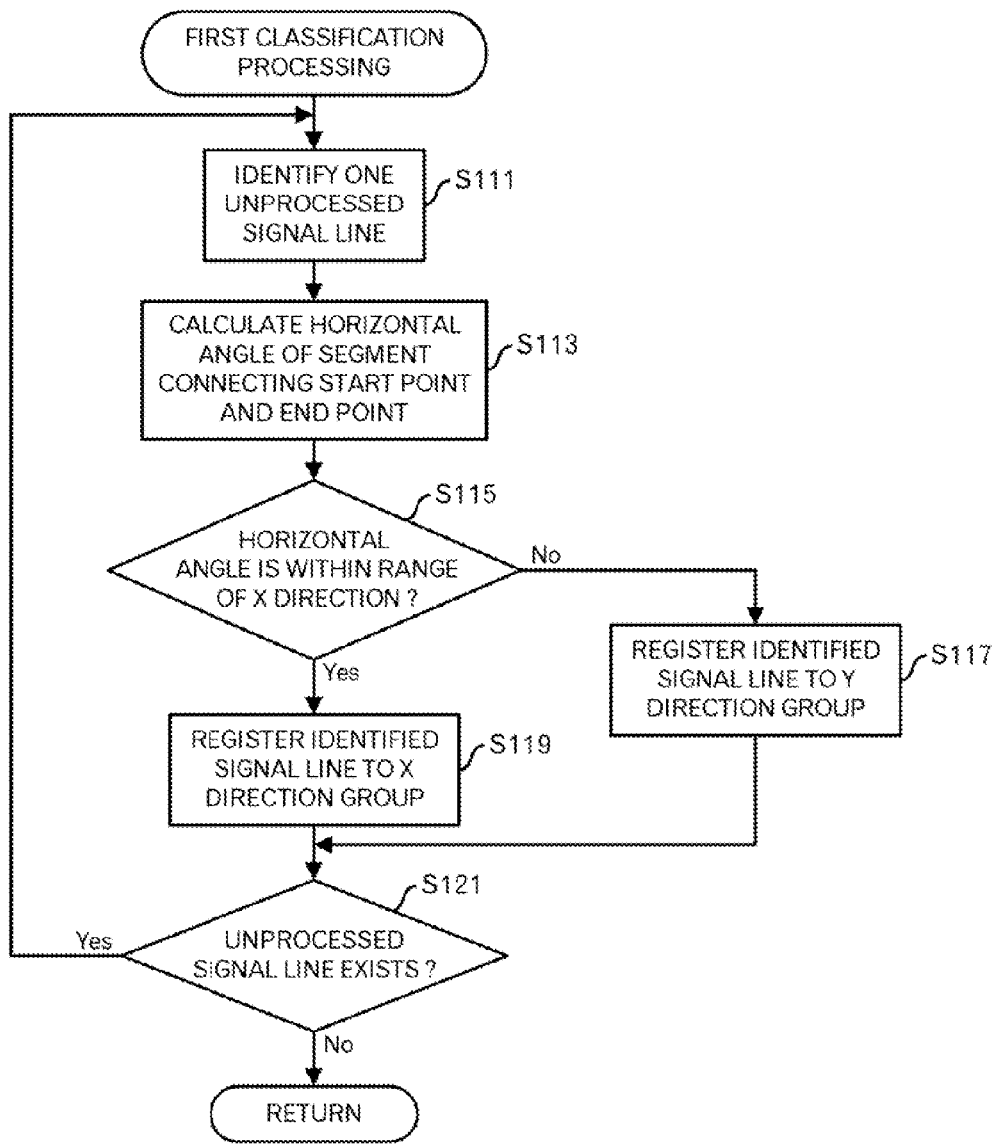
FIG. 21 is a diagram depicting a processing flow of a first classification processing.
Figure 22:
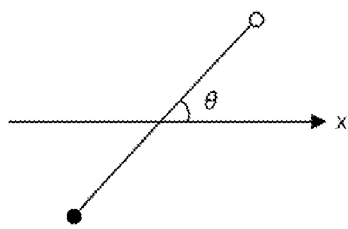
FIG. 22 is a diagram to explain a method for calculating a horizontal angle.

The third classification processing unit 114 identifies one unprocessed signal line among the signal lines included in the first data storage unit 130 (FIG. 21: step S111). Then, the third classification processing unit 114 calculates a horizontal angle of a segment connecting the start point and the end point of the identified signal line, and stores the calculated horizontal angle into the second data storage unit 140, for example (step S113). For example, as illustrated in FIG. 22, the angle θ between the segment from the start point (white circle) to the end point (black circle) and the X-axis is calculated.

Figures 23, 24:
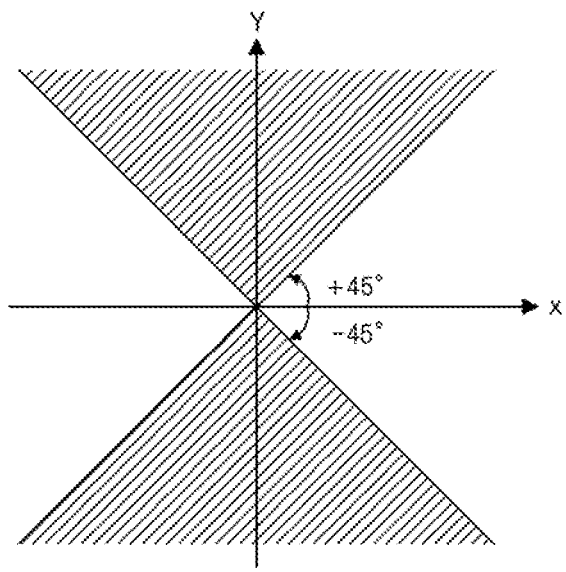
FIG. 23 is a diagram to explain an X direction range and Y direction range.
FIG. 24 is a diagram depicting an example of a result of the initial grouping.

Then, the third classification processing unit 114 determines whether or not the horizontal angle calculated at the step S113 is within a range of the X direction (step S115). In this embodiment, as illustrated in FIG. 23, the range of the X direction is a range surrounded by a straight line obtained by rotating a straight line that passes through the origin and is parallel with the X-axis by 45 degrees around the origin and a straight line obtained by rotating the straight line that passes through the origin and is parallel with the X-axis by −45 degrees around the origin. The remaining range is a range of the Y direction in this example.

When the horizontal angle is within the X direction, the third classification processing unit 114 registers the identified signal line into a X direction group (Dx) (step S119). Then, the processing shifts to step S121. On the other hand, when the horizontal angle is within the Y direction, the third classification processing unit 114 registers the identified signal line into a Y direction group (Dy) (step S117). Then, the processing shifts to the step S121. For example, a list as illustrated in FIG. 24 is registered in the second data storage unit 140. In an example of FIG. 24, the identifiers of the signal lines included in the X direction group are listed in the column of Dx, and the identifiers of the signal lines included in the Y direction group are listed in the column of Dy.

After that, the third classification processing unit 114 determines whether or not there is an unprocessed signal lines among the signal lines included in the data stored in the first data storage unit 130 (step S121). When there is an unprocessed signal line, the processing returns to the step S111. On the other hand, when there is no unprocessed signal line, the processing returns to the calling-source processing.

Figure 25A:
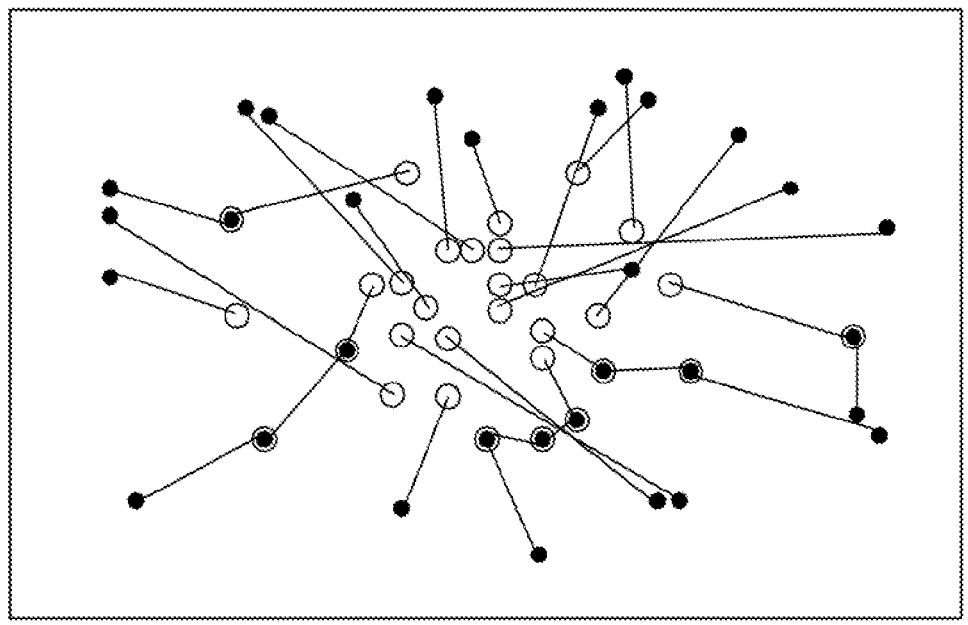
FIG. 25A is a diagram depicting presumed distribution of segments.
Figure 25B:
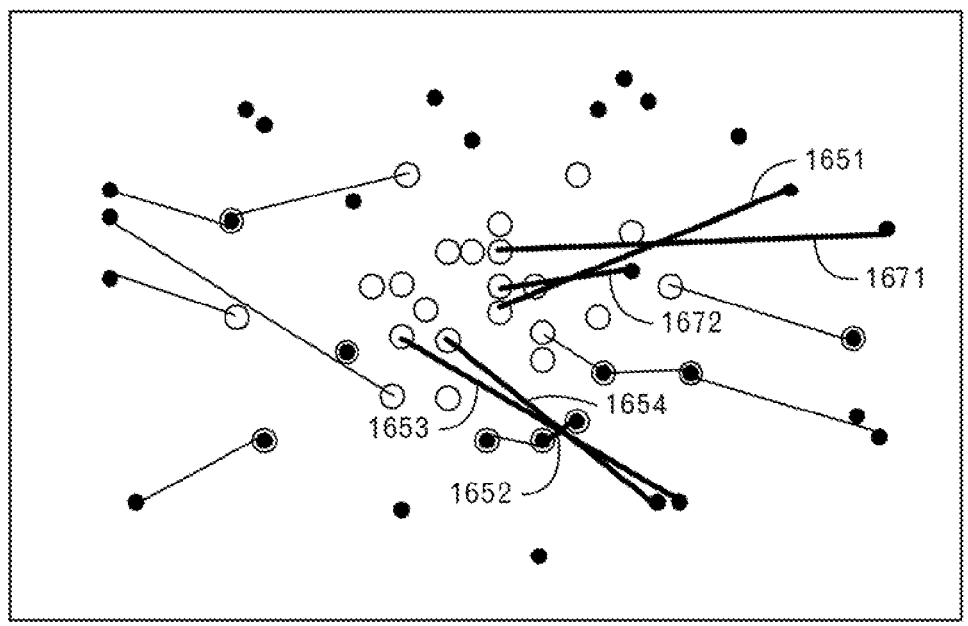
FIG. 25B is a diagram depicting distribution of segments belonging to an X direction group.
Figures 25C, 27:
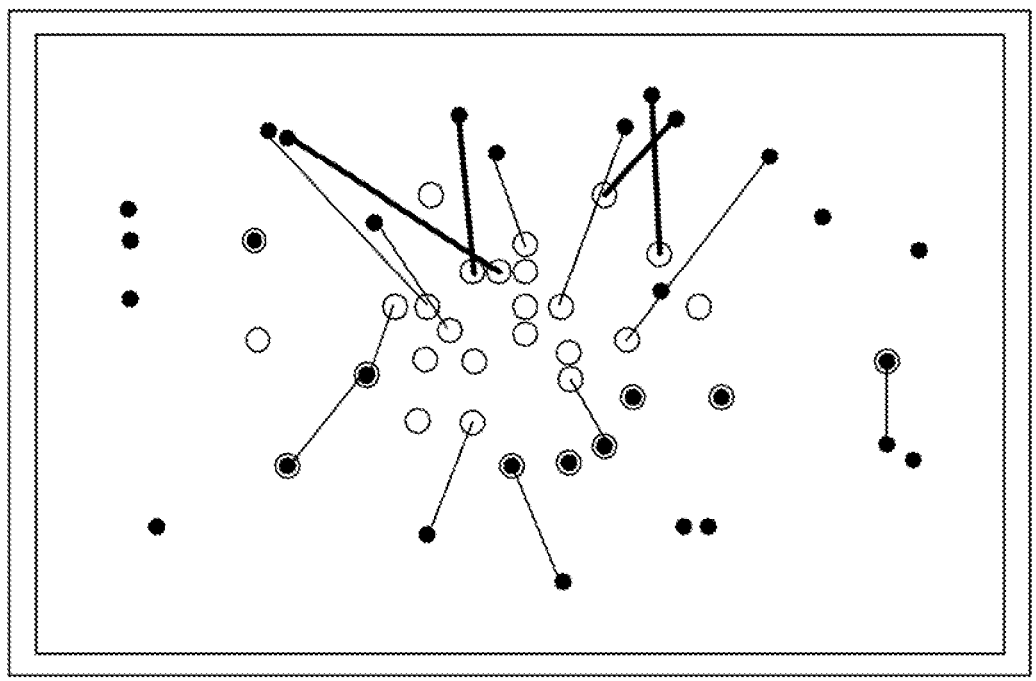
FIG. 25C is a diagram depicting distribution of segments belonging to a Y direction group.
FIG. 27 is a diagram depicting an example of the number of intersecting segments.

Incidentally, when there is distribution of the segments from the start points (white circle) to the end points (black circle) as illustrated in FIG. 25A, the X direction group as illustrated in FIG. 25B and the Y direction group as illustrated in FIG. 25C are separated in the first classification processing.

Returning to the explanation of the processing in FIG. 20, the third classification processing unit 114 determines whether or not the number n of divisions, which was designated by the user, is "2" (step S93). When the number n of divisions is "2", the further classification is not carried out. Therefore, the processing shifts to the step S105. On the other hand, when the number n of divisions is "3" or more, the third classification processing unit 114 sets the number of division groups=2 (step S95), and carries out the second classification processing (step S97). The second classification processing will be explained by using FIGS. 26 to 33.

Figure 26:
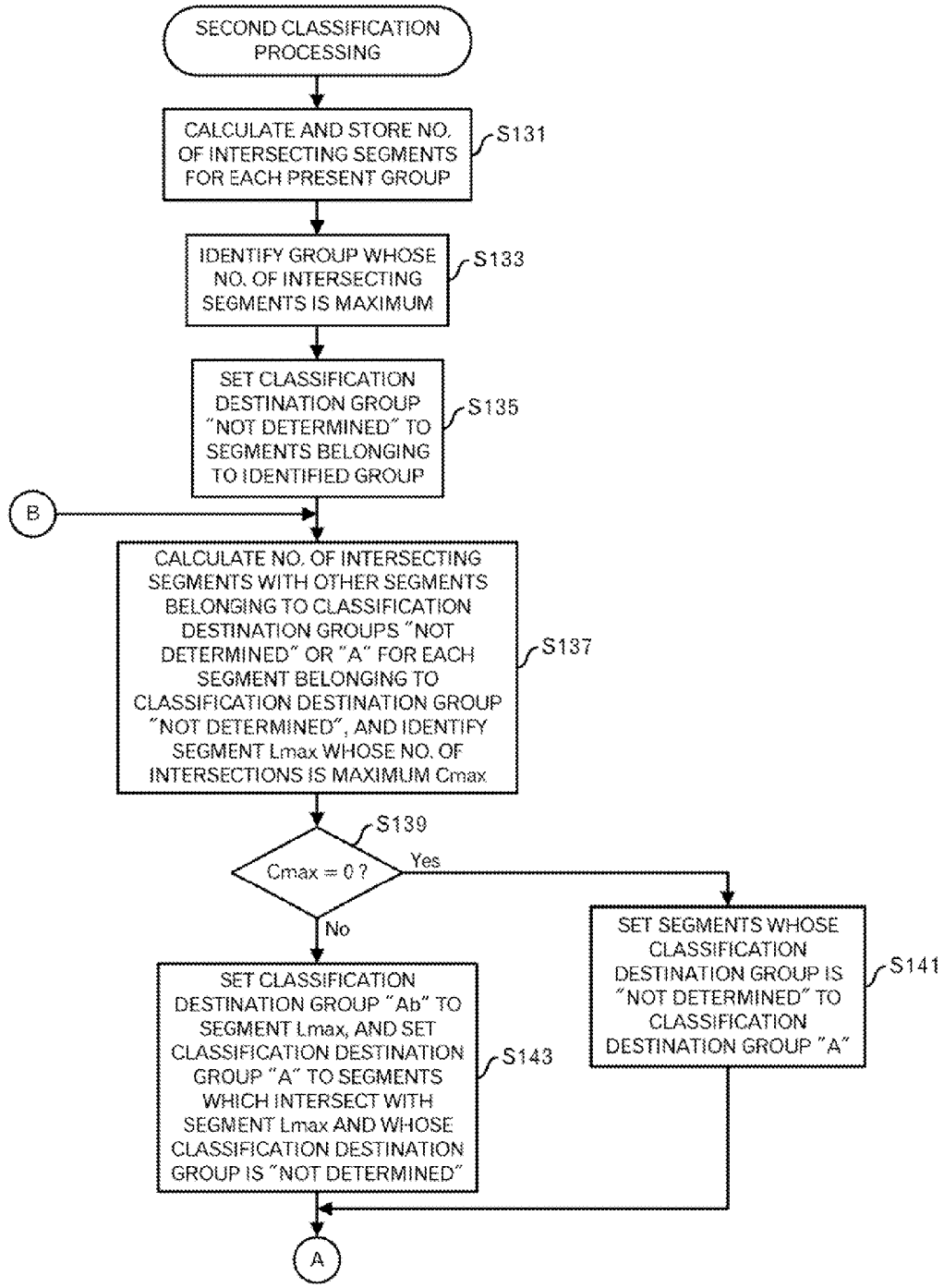
FIG. 26 is a diagram depicting a processing flow of a second classification processing.
Figure 31A:
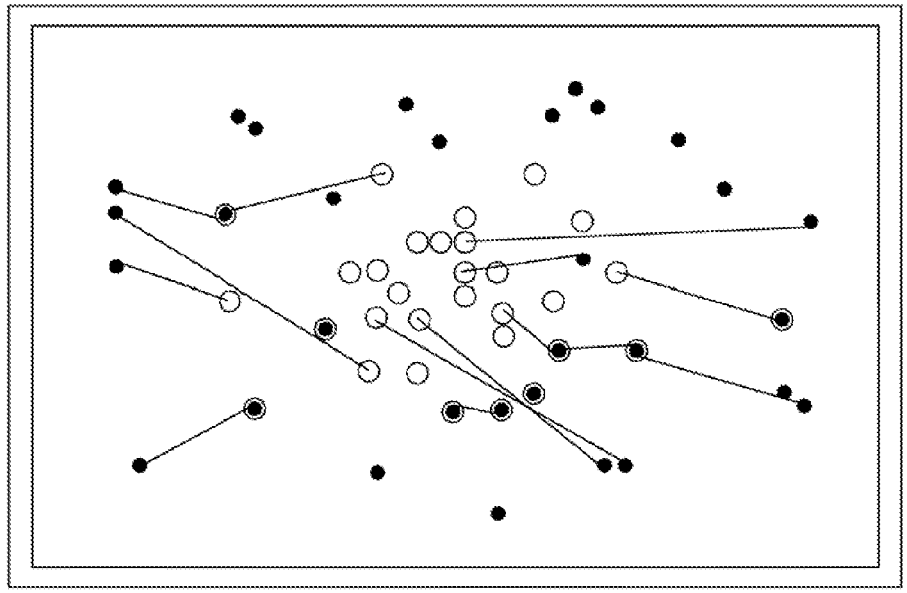
FIG. 31A is a diagram depicting an example of a first group in a result that the segments belonging to the X direction group is further classified.
Figure 31B:
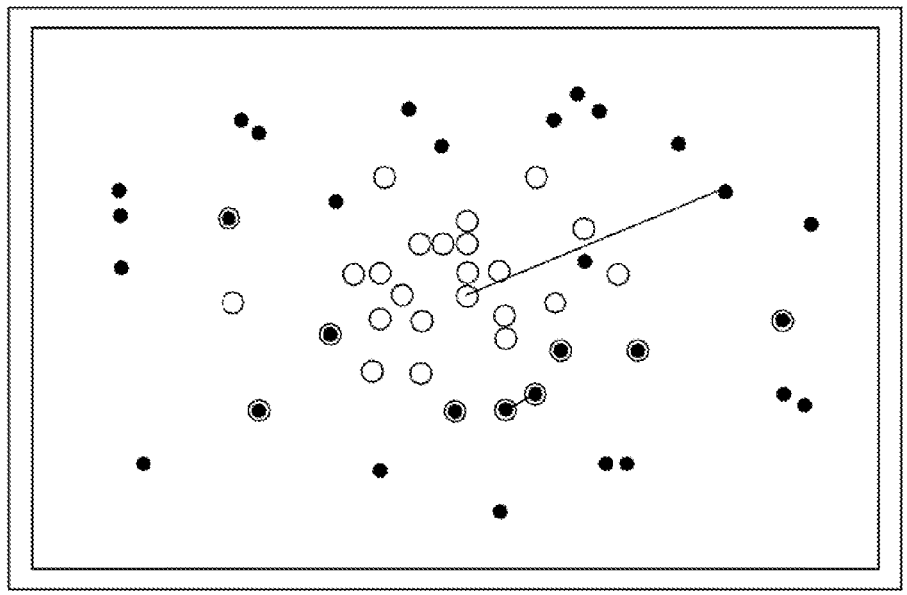
FIG. 31B is a diagram depicting an example of a second group in the result that the segments belonging to the X direction group is further classified.

First, the third classification processing unit 114 causes the intersection processing unit 118 to calculate the number of intersecting segments for each present group, and stores the number of intersecting segments into the second data storage unit 140 (FIG. 26: step S131). For example, according to FIGS. 25B and 25C, as illustrated in FIG. 27, the number "6" of intersecting segments is obtained for the X direction group Dx, and the number "4" of intersecting segments is obtained for the Y direction group Dy, and the numbers are stored in the second data storage unit 140.

Then, the third classification processing unit 114 identifies a group whose number of intersecting segments is the maximum (step S133). After that, the third classification processing unit 114 sets "not determined" as a classification destination group with respect to the segments belonging to the identified group (step S135). For example, data as illustrated in FIG. 28 is prepared in the second data storage unit 140.

Then, the third classification processing unit 114 causes the intersection processing unit 118 to calculate the number of intersections with other segments belonging to a classification destination group "not determined" or "A" (initially, "A" does not exist, because "A" is set in the repetition of this processing) for each of all segments whose classification destination group is "not determined", and identifies, as a segment Lmax, a segment whose number of intersections is the maximum Cmax (step S137). In an example of FIG. 25B, segments 1651 to 1654 are identified because the number of intersections is "2", and Cmax=2. Incidentally, in the example of FIG. 25B, the segments 1652 to 1654 are intersecting each other.

After that, the third classification processing unit 114 determines whether or not Cmax is equal to "0" (step S139). When there is no intersection, further processing cannot be made. Therefore, the third classification processing unit 114 sets the classification destination group "A" for the segments whose classification destination group is "not determined" in the second data storage unit 140 (step S141). Then, the processing shifts to a processing in FIG. 32 through a terminal A.

On the other hand, when Cmax is not equal to "0" but equal to or greater than "1", the third classification processing unit 114 sets the classification destination group "Ab" for the segment Lmax, and sets the classification destination group "A" for the segments whose classification destination group "not determined" and which intersects with the segment Lmax (step S143). After that, the processing shifts to the processing of FIG. 32 through the terminal A. "A" and "Ab" are identifiers to identify the grouping for convenience's sake, and other identifiers may be used.

For example, in the example of FIG. 25B, when the segment 1651 is Lmax, the classification destination group "Ab" is set to the segment 1651, and the classification destination group "A" is set to the segments 1671 and 1672 that intersects with the segment 1651. Moreover, when the segment 1652 is Lmax, the classification destination group "Ab" is set to the segment 1652. As for the segments 1653 and 1654 that intersect with the segment 1652, the number of divisions is "2" and the segments 1653 and 1654 are Lmax. However, when the same classification destination group "Ab" is set to the segments that intersects each other, it is impossible to reduce the number of intersections. Therefore, by picking up one segment Lmax, the classification destination group "Ab" is set to the segment 1652, and the classification destination group "A" is set to the segments 1653 and 1654 that intersect with the segment 1652 in order not to classify the segments 1653 and 1654 into the same classification destination group. In other words, a state of the data stored in the second data storage unit 140, which is illustrated in FIG. 29, is updated to a state as illustrated in FIG. 30. The disposition state of the segments in FIG. 25B is divided into a state of the classification destination group "A" in FIG. 31A and a state of the classification destination group "Ab" in FIG. 31B. Thus, in the classification destination group "A", the maximum number of intersections Cmax is "1", and in the classification destination group "Ab", the maximum number of intersections Cmax is "0".

Figures 32, 33:
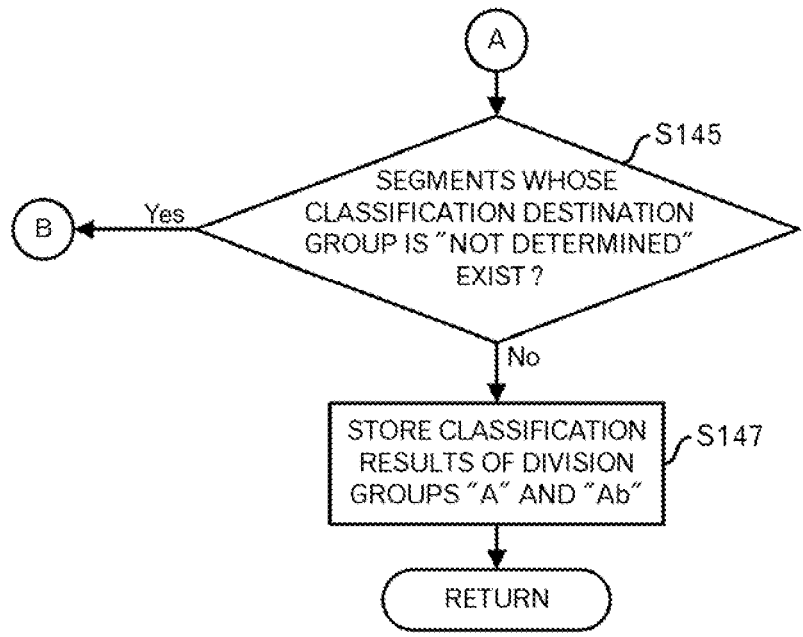
FIG. 32 is a diagram depicting a processing flow of the second classification processing.
FIG. 33 is a diagram depicting an example of processing results of the second classification processing.

Shifting to the explanation of the processing in FIG. 32, the third classification processing unit 114 determines whether or not a segment whose classification destination group is "not determined" remains (step S145). When the segment whose classification destination group "not determined" remains, the processing returns to the step S137 through a terminal B. On the other hand, when the segment whose classification destination group "not determined" does not remain, the third classification processing unit 114 stores the classification result for the classification destination groups "A" and "Ab" into the second data storage unit 140 for the next second classification processing (step S147). Then, the processing returns to the calling-source processing.

In the aforementioned example, the Y direction group and classification destination groups "A" and "Ab" are the present groups to be processed at the next step S131. Therefore, for example, data as illustrated in FIG. 33 is generated and stored in the second data storage unit 140. In an example of FIG. 33, a list of the signal line identifiers of the signal lines belonging to the classification destination group "A", a list of the signal line identifiers of the signal lines belonging to the classification destination group "Ab" and a list of the signal line identifiers of the signal lines belonging to the Y direction group Dy are stored.

Returning to the explanation of the processing of FIG. 20, the third classification processing unit 114 determines whether or not the group division was carried out in the second classification processing (step S99). When there is no intersection at the first, namely, Cmax=0, the group division is not carried out. Therefore, when the group division was not carried out, the processing shifts to the step S105. On the other hand, when the group division was carried out, the third classification processing unit 114 calculates the number of division groups=the number of division groups+1 (step S101), and determines whether or not the calculated number of division groups is equal to the number "n" of divisions (step S103). When the calculated number of division groups does not reach the number of divisions "n", the processing returns to the step S97.

On the other hand, when the calculated number of division groups reached the number of divisions "n", the processing shifts to the step S105.

Then, the third classification processing unit 114 stores the identifiers of the signal lines of the terminals in the second data storage unit 140 based on the classification processing results in association with the group identifiers corresponding to the terminals (step S105). The group identifier may be converted to the number.

By carrying out the grouping in order to reduce the intersections, the easiness of the wiring is improved.

Figure 34:
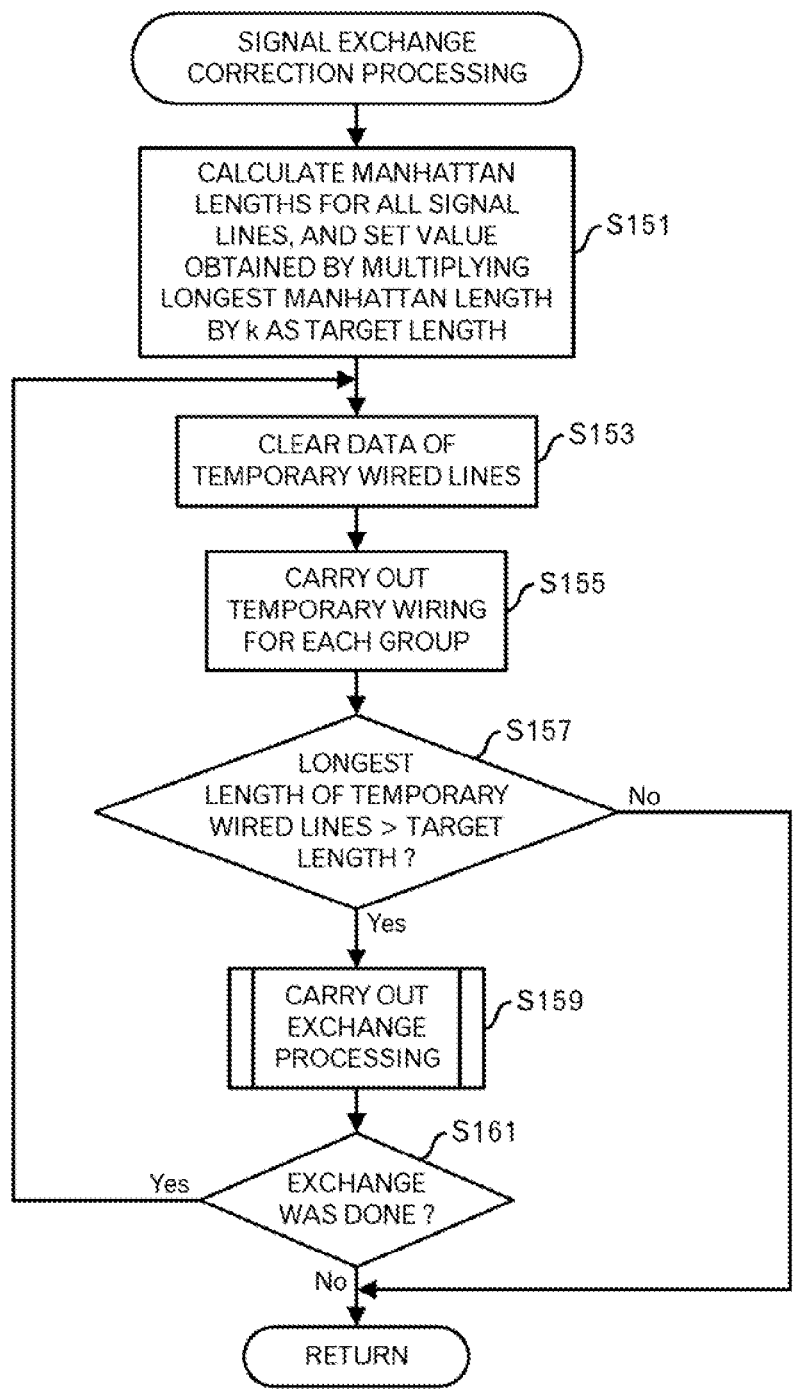
FIG. 34 is a diagram depicting a processing flow of a signal exchange correction processing.

Next, the signal exchange correction processing for shortening the lengths of the lines will be explained by using FIGS. 34 to 41. First, the signal exchange correction processing unit 115 causes the manhattan length processing unit 120 to calculate the manhattan lengths for all signal lines, and sets a value obtained by multiplying the longest manhattan length by a coefficient k (e.g. 1.1) as a target length (FIG. 34: step S151). The calculation method of the manhattan length is well-known, and further explanation is omitted.

Then, the signal exchange correction processing unit 115 causes the temporary wiring processing unit 117 to clear the present temporary wiring data (initially, no data) (step S153). Then, the signal exchange correction processing unit 115 causes the temporary wiring processing unit 117 to carry out the temporary wiring for each group (step S155). Data (identifiers of the signal lines, figure data of the temporary wiring, lengths of temporary wired line) of the temporary wiring is stored in the second data storage unit 140.

Figure 35A:
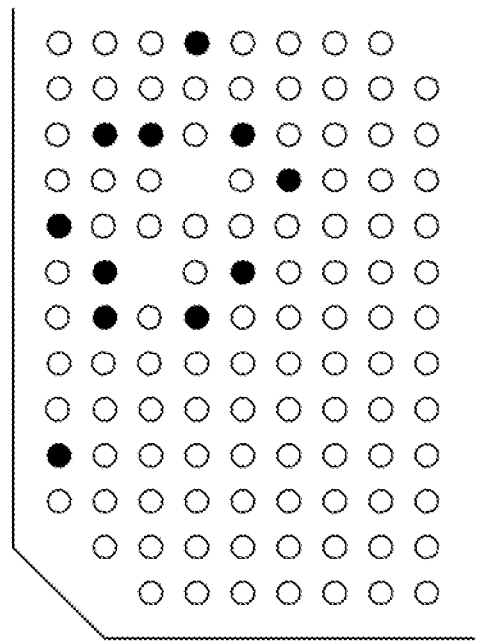
FIG. 35A is a diagram depicting an example of a first group of terminals.
Figure 35B:
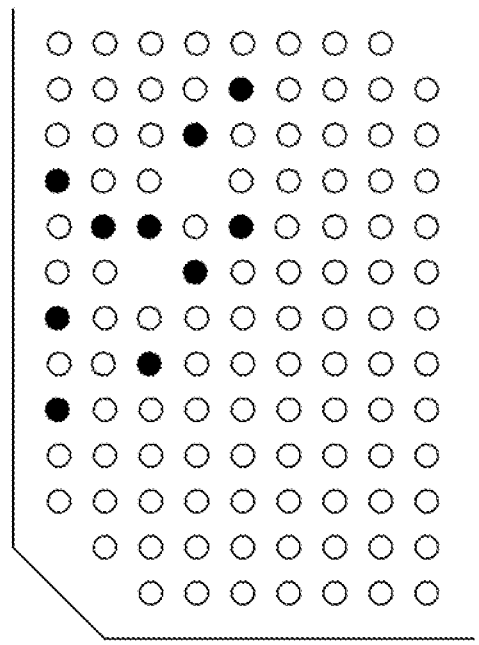
FIG. 35B is a diagram depicting an example of a second group of terminals.
Figure 35C:
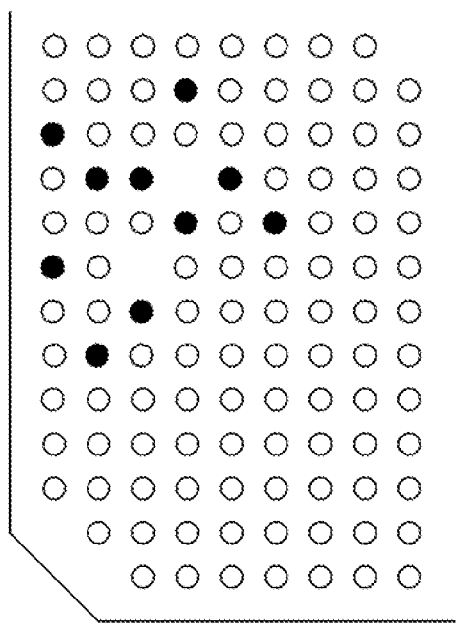
FIG. 35C is a diagram depicting an example of a third group of terminals.
Figure 36A:
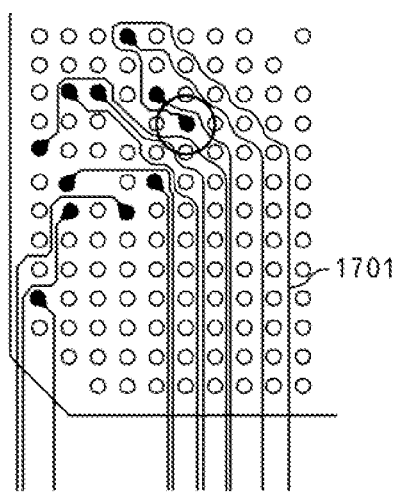
FIG. 36A is a diagram depicting an example of a result obtained by carrying out the temporary wiring for the first group of the terminals.
Figure 36B:
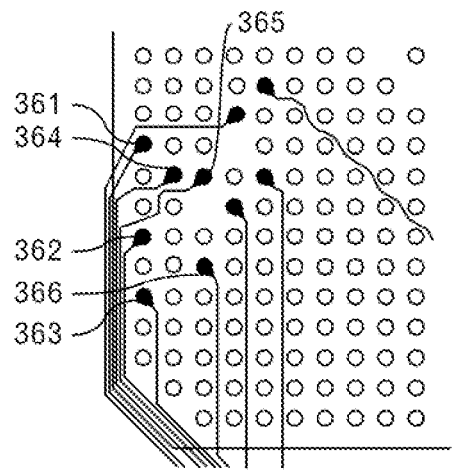
FIG. 36B is a diagram depicting an example of a result obtained by carrying out the temporary wiring for the second group of the terminals.
Figure 36C:
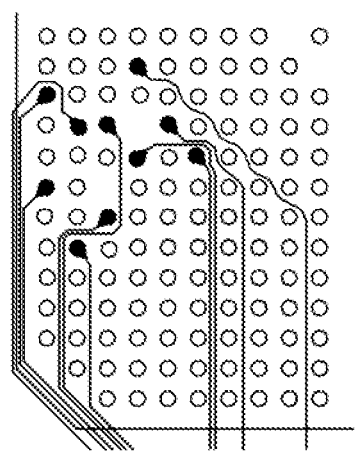
FIG. 36C is a diagram depicting an example of a result obtained by carrying out the temporary wiring for the third group of the terminals.

For example, it is assumed that the signal lines are divided into three groups as illustrated in FIGS. 35A to 35C (only start terminals are illustrated). When, for example, the temporary wiring is carried out in such a state, the temporary wiring is carried out as illustrated in FIG. 36A for the group in FIG. 35A, and the temporary wiring is carried out as illustrated in FIG. 36B for the group in FIG. 35B, and the temporary wiring is carried out as illustrated in FIG. 36C for the group in FIG. 35C.

The signal exchange correction processing unit 115 identifies the signal line identifier, belonging group and the length of the temporary wired line whose length is the longest from data of the lengths of the temporary wired lines, which is stored in the second data storage unit 140, and determines whether or not the longest length of the temporary wired line is greater than the target length (step S157). For example, it is assumed that a temporary wired line 1701 extending from the start terminal illustrated with the circle in FIG. 36A is identified as a signal line having the longest length of the temporary wired line.

When the longest length of the temporary wired line is equal to or less than the target length, it is possible to consider that the lengths of the wired lines have been shortened without carrying out the processing described below. Therefore, the processing returns to the calling-source processing.

On the other hand, when the longest length of the temporary wired lines is greater than the target length, the signal exchange correction processing unit 115 carries out an exchange processing (step S159). The exchange processing will be explained by using FIGS. 37 to 41.

Figure 37:
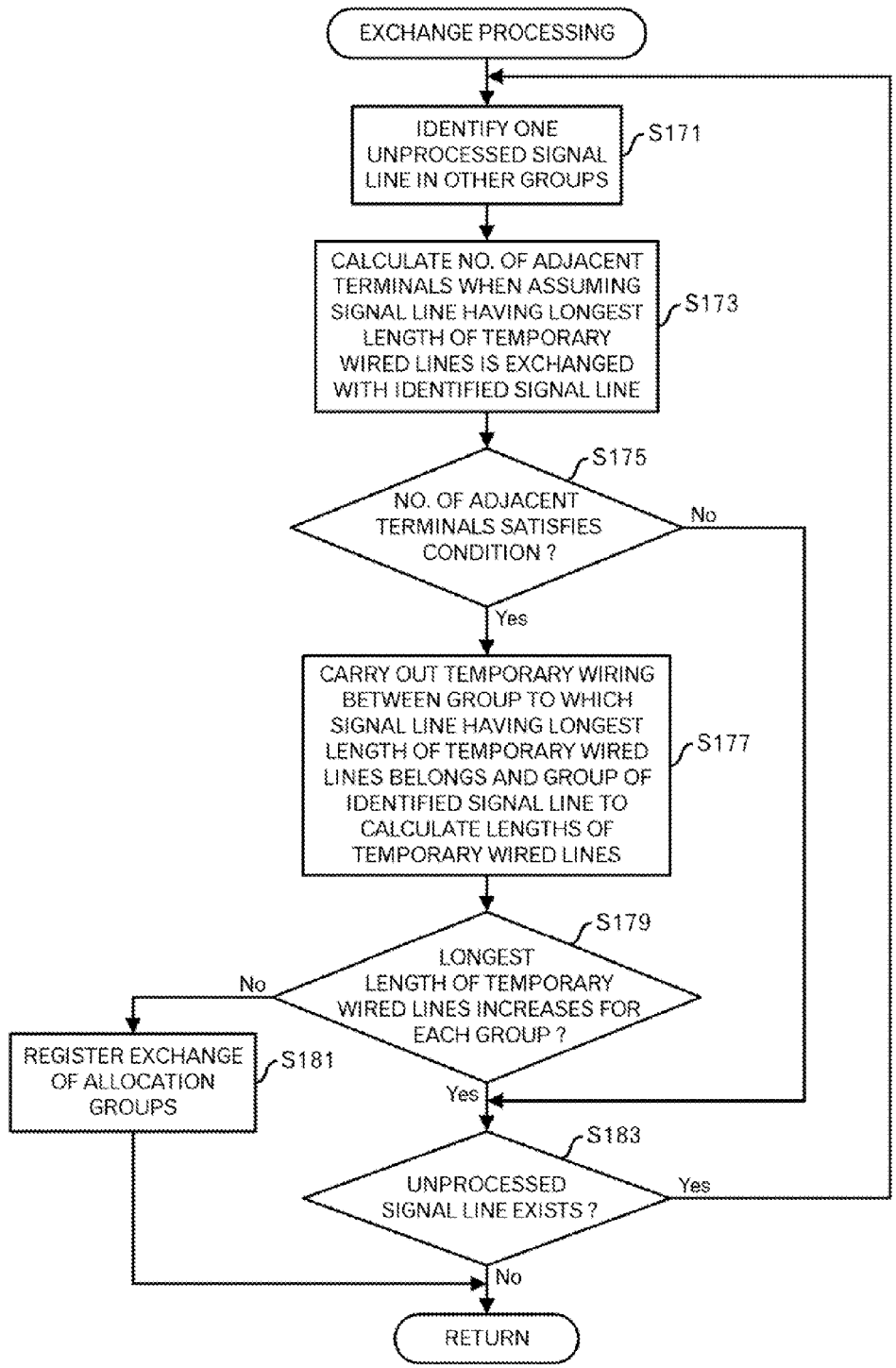
FIG. 37 is a diagram depicting a processing flow of an exchange processing.

First, the signal exchange correction processing unit 115 identifies one unprocessed signal line in a group different from a group to which the signal line whose length of the temporary wired line is the longest belongs (FIG. 37: step S171). For example, in FIG. 36B, the signal terminals 361, 362, 363, 364, 365 and 366 are selected in sequence. Then, the signal exchange correction processing unit 115 calculates the number of adjacent terminals or an adjacent cost before and after exchanging the signal lines whose length of the temporary wired line is the longest with the identified signal line, and stores the calculation results into the second data storage unit 140 (step S173).

Figure 38:
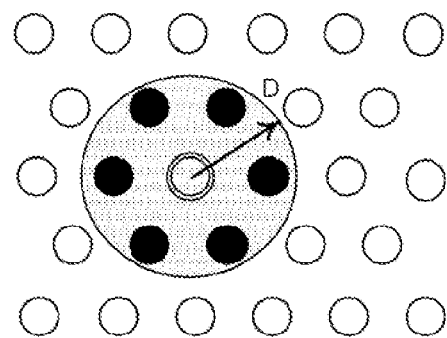
FIG. 38 is a diagram depicting an example of a method for counting the number of adjacent terminals.
Figure 39:
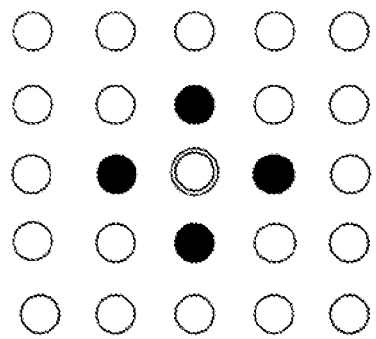
FIG. 39 is a diagram depicting an example of a method for calculating an adjacent cost.

When the number of adjacent terminals is calculated, as illustrated in FIG. 38, signal terminals (black circles) included within a predetermined distance D from the marked signal terminal (double circle) are identified. Then, simply, the number of identified terminals may be counted. On the other hand, as illustrated in FIG. 39, when the signal terminals are lined up, the number of signal terminals (black circles) that are vertically or horizontally adjacent to the marked signal terminal (double circle) may be counted. However, instead of the simple number of signal terminals, the cost may be calculated by adding the cost "1" when the signal terminal is vertically or horizontally adjacent to the marked signal terminal and adding the cost "0.5" when the signal terminal is obliquely adjacent to the marked signal terminal.

Figure 40:
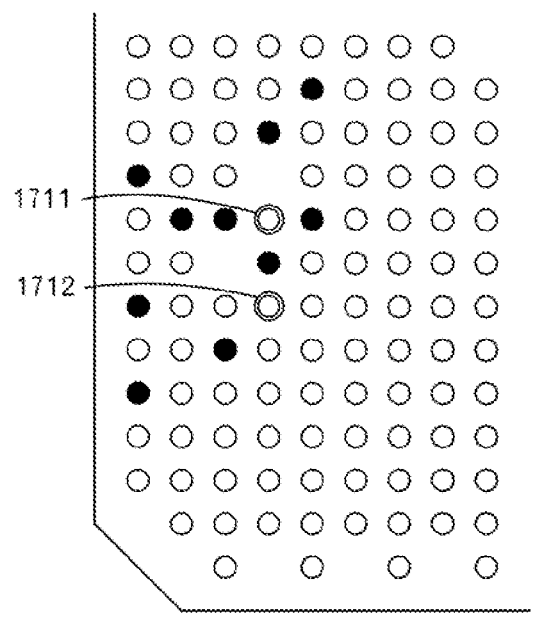
FIG. 40 is a diagram to explain an example of the calculation of the number of adjacent terminals and adjacent cost.

For example, as illustrated in FIG. 40, in case of the marked signal terminal 1711, the adjacent terminals exist on both sides and under the marked signal terminal. Therefore, the number of adjacent terminals is "3" and the adjacent cost is also "3". On the other hand, in case of the marked signal terminals 1712, the adjacent terminals exist above the marked signal terminal and on the lower-left of the marked terminal. Therefore, the number of adjacent terminals is "1" and the adjacent cost is "1.5". Incidentally, as for the obliquely adjacent cost, other value may be added instead of "0.5".

Figure 41:
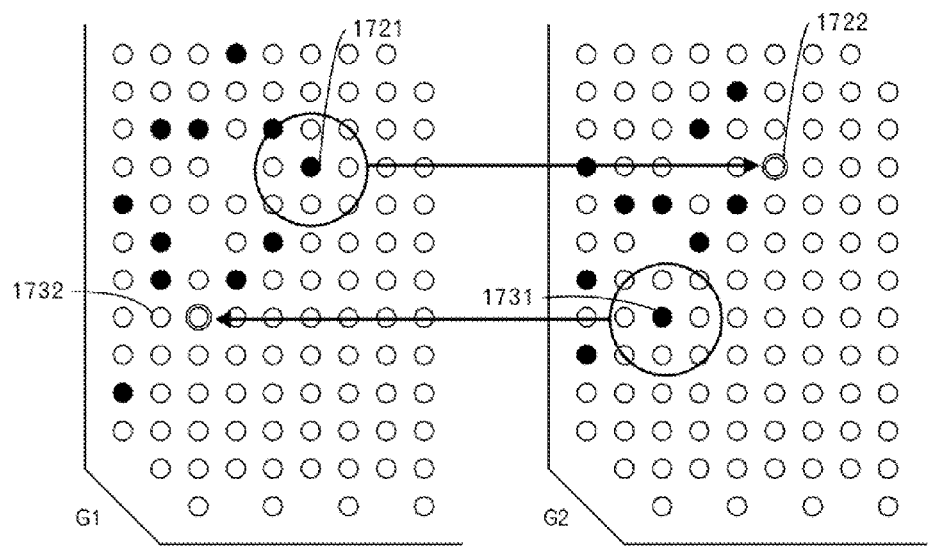
FIG. 41 is a diagram to explain an example of the calculation of the number of adjacent terminals and adjacent cost.

More specifically, as illustrated in FIG. 41, it is assumed that a signal terminal 1721 in group G1 is moved to group G2, and temporarily disposed on the position of the signal terminal 1722 (i.e. the same position on a different layer). Instead of this movement, it is assumed that a signal terminal 1731 in the group G2 is moved to the group G1, and temporarily disposed on the position of the signal terminal 1732 (i.e. the same position on a different layer). Then, before the exchange, namely, in a state surrounded by the circle, the number of adjacent terminals for the signal terminal 1721 is calculated as "0", and the adjacent cost is calculated as "0.5". On the other hand, after the exchange, namely, in a state designated by an arrow, the number of adjacent terminals for the signal terminal 1722 is calculated as "0", and the adjacent cost is calculated as "0.5". In other words, there is no change before and after the exchange. On the other hand, before the exchange, namely, in the state surrounded by the circle, the number of adjacent terminals for the signal terminal 1731 is calculated as "0", and the adjacent cost is calculated as "0". On the other hand, after the exchange, namely, in a state designated by an arrow, the number of adjacent terminals for the signal terminal 1732 is "0", and the adjacent cost is calculated as "1.0". In other words, the number of adjacent terminals is not changed before and after the exchange, however, the adjacent cost increases by "+1.0". Incidentally, because the single layer wiring is carried out, the number of adjacent terminals or the adjacent cost is calculated for not only the start terminal or end terminal, but also both of them.

Then, the signal exchange correction processing unit 115 determines whether or not the number of adjacent terminals or the adjacent cost, which was calculated at the step S173, satisfies a condition (step S175). For example, it is determined whether or not a condition that the number of adjacent terminals does not increase before to after the exchange or whether or not the adjacent cost does not increase before to after the exchange. Furthermore, both conditions may be adopted.

When the number of adjacent terminals or the adjacent cost, which was calculated at the step S173, does not satisfy the condition, the processing shifts to step S183. On the other hand, when the number of adjacent terminals or the adjacent cost, which was calculated at the step S173, satisfies the condition, the signal exchange correction processing unit 115 causes the temporary wiring processing unit 117 to carry out the temporary wiring for a state after the exchange was carried out between the group to which the signal line having the longest length of the temporary wired line belongs and the group to which the signal line identified at the step S171 belongs, and to store data of the temporary wired lines (identifiers of the signal lines, figure data of the temporary wired lines, lengths of the temporary wired lines and the like) in the second data storage unit 140 (step S177).

Then, the signal exchange correction processing unit 115 determines, for each group of the group to which the signal line having the longest length of the temporary wired lines belongs and the group to which the signal line identified at the step S171 belongs, whether or not the longest length of the temporary wired lines increases (step S179). When the longest length of the temporary wired lines does not increase for each group, it is determined that it is possible to exchange the terminals. Therefore, the signal exchange correction processing unit 115 registers the exchange of the belonging group in the second data storage unit 140 (step S181). More specifically, the belonging group of the signal line that has the longest length of the temporary wired lines, and was identified at the step S155 is changed to the group of the signal line identified at the step S171, and the group of the signal line identified at the step S171 is changed to the belonging group of the signal line that has the longest length of the temporary wired lines, and was identified at the step S155. Then, the processing returns to the calling-source processing.

On the other hand, when the longest length of the temporary wired lines increases, it is determined that the exchange is impossible. Therefore, the signal exchange correction processing unit 115 determines whether or not there is an unprocessed signal line (step S183). When there is an unprocessed signal line, the processing returns to the step S171. On the other hand, when there is no unprocessed signal line, the processing returns to the calling-source processing.

By carrying out such a processing, it becomes possible to change the belonging group so that the longest length of the temporary wired lines is shortened. Making the longest length of the temporary wired lines shorter is effective for both of the easiness of adjusting the lengths of the lines and easiness of the wiring.

Returning to the explanation of the processing in FIG. 34, the signal exchange correction processing unit 115 determines whether or not the exchange of the signal lines was carried out (step S161). When the exchange of the signal lines was carried out, the processing returns to the step S153. In other words, it is confirmed whether or not the longest length of the temporary wired lines is equal to or less than the target length in the state after the exchange. Incidentally, because the temporary wiring was carried out again at the step S159 for the influenced groups, the processing may returns to the step S157. On the other hand, when the exchange of the signal line is not carried out, the further adjustment cannot be made. Therefore, the processing returns to the calling-source processing.

By carrying out the aforementioned processing, it is possible to correct the classification so that the longest length of the temporary wired lines is shortened. Therefore, the easiness of adjusting the lengths of the lines and easiness of the wiring are improved.

Next, the line-length-based classification processing for carrying out the grouping so that the longest length of the lines is shortened while suppressing the deviation of the distribution of the lengths of the lines among the plural groups will be explained by using FIGS. 42 to 50.

Figure 42:
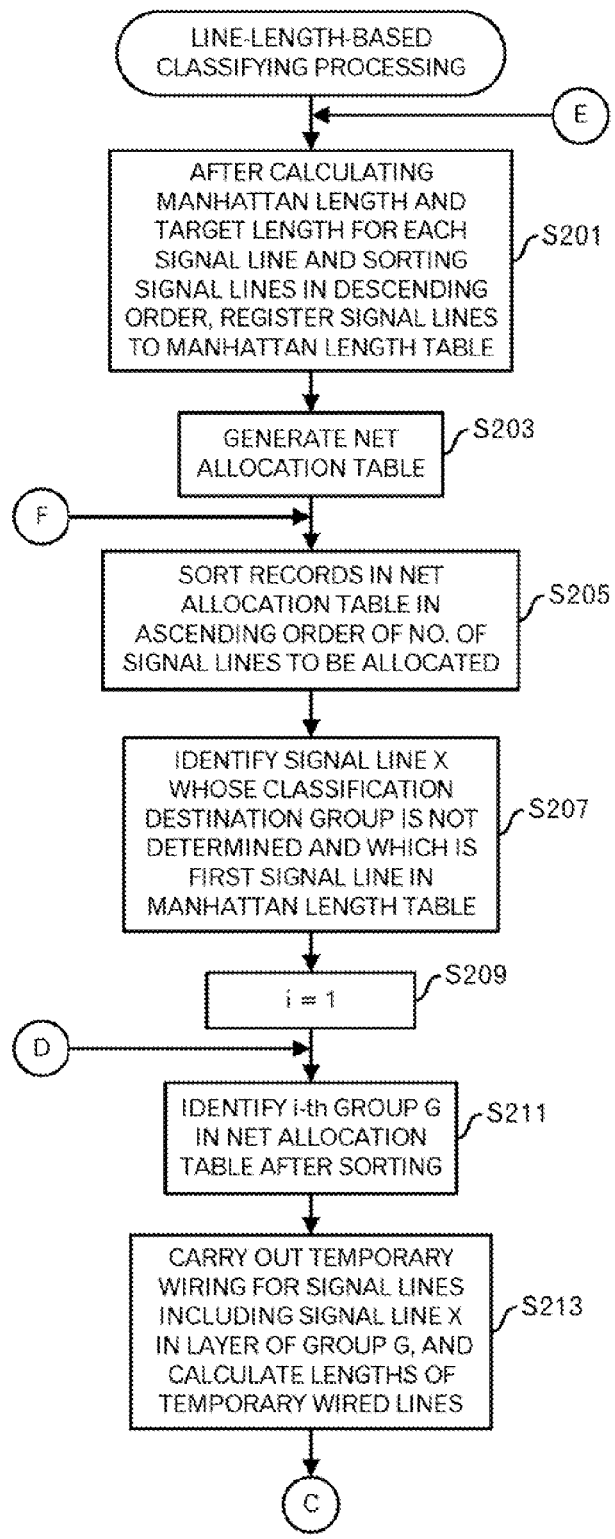
FIG. 42 is a diagram depicting a processing flow of a line-length-based classifying processing.
Figure 44:
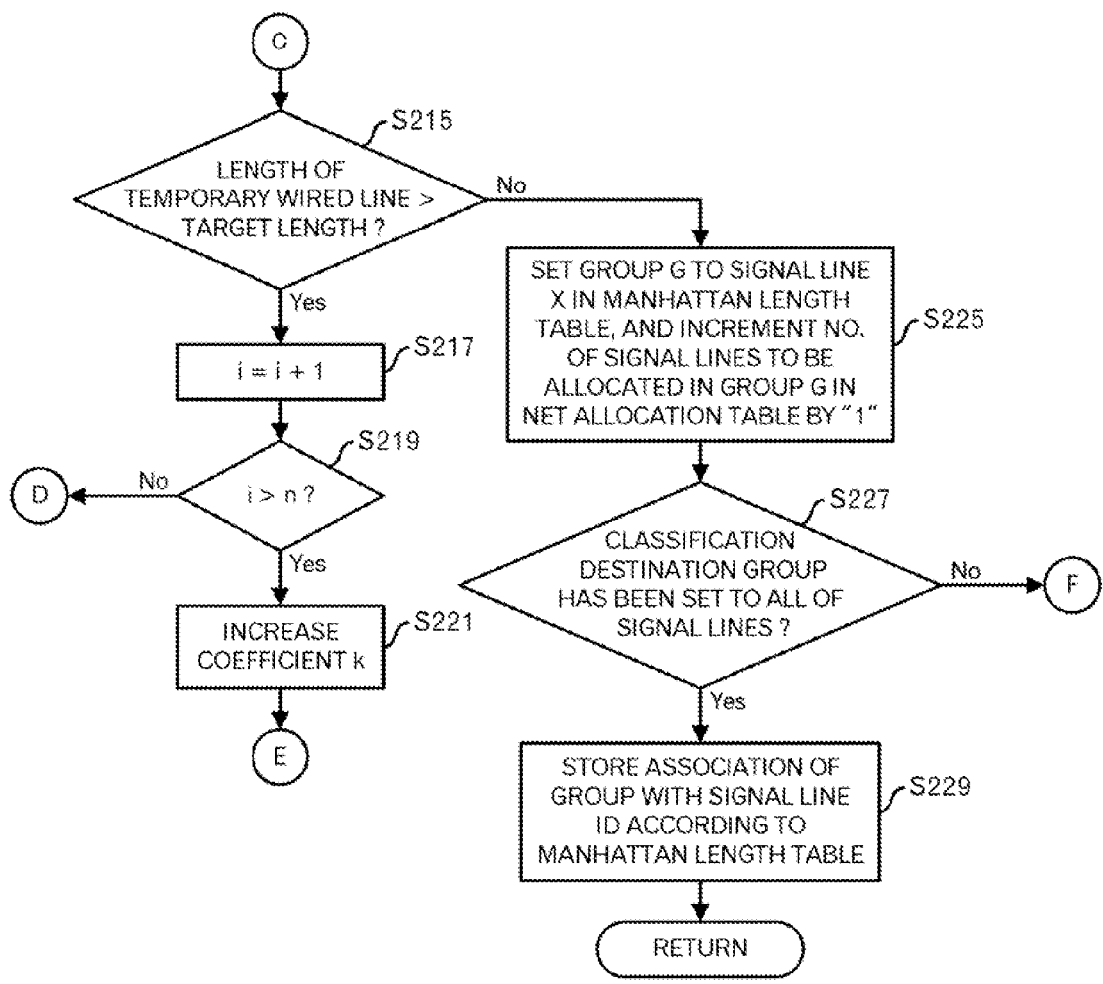
FIG. 44 is a diagram depicting a processing flow of the line-length-based classifying processing.

The fourth classification processing unit 116 causes the manhattan length processing unit 120 to calculate, for each signal line, the manhattan length and a target length (e.g. manhattan length*k(=1.1)), and after sorting in descending order of the lengths of the lines, the fourth classification processing unit 116 stores the manhattan lengths and target lengths in a manhattan length table in the second data storage unit 140 (FIG. 42: step S201). For example, it is assumed that the manhattan length table as illustrated in FIG. 43A is generated. In an example of FIG. 43A, the signal line identifier, the manhattan length, the target length, and the length of the temporary wired line and the classification destination group are registered in the manhattan length table. The length of the temporary wired line and the classification destination group are not registered in this stage. Moreover, the signal lines are sorted in descending order of the manhattan length.

Next, the fourth classification processing unit 116 generates a net allocation table for registering the number of signal lines for each group of n groups, (n correspond to the number of divisions), and stores the generated net allocation table into the second data storage unit 140 (step S203). The net allocation table as illustrated in FIG. 43B is generated. In an example of FIG. 43B, for each group A, B or C, the number of signal lines to be allocated will be stored.

Then, the fourth classification processing unit 116 sorts records in the net allocation table in ascending order of the number of signal lines to be allocated (step S205). Initially, as for the all groups, the number of signal lines to be allocated is "0", and the state of FIG. 43B does not changed. By doing the aforementioned processing, it becomes possible to allocate the signal lines to each group as uniformly as possible.

After that, the fourth classification processing unit 116 identifies a signal line X, for which classification destination group is not determined and which appears firstly in the manhattan length table, from the manhattan length table (step S207). In an example of FIG. 43A, first, the signal line "1" included in the first record is identified.

Then, the fourth classification processing unit 116 initializes a counter i to "1" (step S209), and identifies an i-th group G in the net allocation table after the sorting (step S211). In the example of FIG. 43B, in case of i=1, the group "A" is identified.

After that, the fourth classification processing unit 116 causes the temporary wiring processing unit 117 to carry out the temporary wiring for the signal lines including the signal line X on the layer of the group G, and to calculate the length VL of the temporary wired line of the signal line X, and to register the calculated value into the manhattan length table in the second data storage unit 140 (step S213). Firstly, there is no signal line belonging to the group G. Therefore, the temporary wiring is carried out only for the signal line X. In the next and subsequent processing, the temporary wiring is carried out together with other signal lines that are assumed to belong to the group G. Thus, when the temporary wiring is carried out in descending order of the manhattan length of the signal line, other signal lines that prevents from carrying out the temporary wiring is a few. Therefore, it is expected that the length of the temporary wired line is shortened. In other words, it is possible to make the maximum value of the lengths of the temporary wired lines shorter. The processing shifts to the processing of the FIG. 44 through the terminal C.

Then, the fourth classification processing unit 116 determines whether or not a condition that the length VL of the temporary wired line, which was calculated at the step S213, is greater than the target length TL of the signal line X is established (step S215). When the condition that the length VL of the temporary wired line is greater than the target length TL is established, the length VL of the temporary wired line becomes longer than the target length TL even when the signal line X is allocated to the group G. Therefore, allocation of the signal line X to another group is tried. In other words, the fourth classification processing unit 116 increments the counter i by "1" (step S217), and determines whether or not the value of the counter i exceeds the number n of divisions (step S219). Incidentally, data of the temporary wired lines generated at the step S213 is cleared at this step. When the value of the counter i is equal to or less than the number n of divisions, the processing returns to the step S211 through a terminal D.

On the other hand, when the value of the counter i exceeds the number n of divisions, the fourth classification processing unit 116 increases the value of the coefficient k used when calculating the target length TL from the manhattan length (step S221). For example, k=k+0.1 is calculated. This is because it is impossible to carry out the grouping in the present assumption, and the target length TL is then changed. Then, the processing returns to the step S201 in FIG. 42 through a terminal E. The aforementioned processing will be carried out again.

On the other hand, when it is determined at the step S215 that the length VL of the temporary wired line is equal to or less than the target length TL of the signal line X, the fourth classification processing unit 116 sets the group G as classification destination group in the manhattan length table for the signal line X, and increments the number of signal lines to be allocated to the group G in the net allocation table (step S225).

For example, as for the signal line X having the signal line identifier "1", when the length of the temporary wired line VL=80.060 mm and the target length TL=83.600 mm are obtained, the length VL of the temporary wired line is equal to or less than the target length TL. Therefore, as illustrated in FIG. 45, "A" is registered as the classification destination group. Furthermore, as illustrated in FIG. 46, the number of signal lines to be allocated of the group A is updated to "1" in the net allocation table.

After that, the fourth classification processing unit 116 determines whether or not the classification destination group has been set to all of the signal lines in the manhattan length table (step S227). When there is a signal line to which the classification destination group has not been set, the processing returns to the step S205 of FIG. 42 through a terminal F.

In the aforementioned example, as illustrated in FIG. 47, the signal line "4" in the second record in the manhattan length table is set as the signal line X. In addition, the records in the net allocation table are sorted, and the group B is arranged to the top of the net allocation table as illustrated in FIG. 48. In other words, in order of the group B, group C and group A, allocation of the signal line "4" is tried.

On the other hand, when it is determined at the step S227 that the classification destination group is set for all of the signal lines, the fourth classification processing unit 116 stores the group identifier in the second data storage unit 140 in association with the signal line identifier according to the manhattan length table (step S229). For example, for each group, a list of signal lines belonging to the group are generated and stored.

After that, when the aforementioned processing is repeated, the manhattan length table finally becomes in a state as illustrated in FIG. 49. In addition, the net allocation table becomes in a state as illustrated in FIG. 50. As described above, in descending order of the manhattan length, the signal lines are allocated to the groups whose number of the signal lines to be allocated is lesser. In other words, while suppressing the deviation of the number of signal lines and the distribution of the lengths of the lines among the plural groups, the grouping is carried out.

Although the embodiment of this technique was explained above, this technique is not limited to the embodiment. For example, the functional block diagram of the wiring support apparatus 100 illustrated in FIG. 5 is a mere example, and does not correspond to an actual program module configuration. Moreover, as for the processing flow, as long as the processing results do not change, the order of the steps may be exchanged or the steps may be executed in parallel. As for the data storage method, the aforementioned mode is a mere example, and other mode may be adopted.

Although the wiring support apparatus 100 is formed, as one example, by one computer, the wiring support apparatus 100 may be formed by plural computers. Furthermore, the wiring support apparatus 100 may be implemented as a stand alone type system or client-server type system. In other words, in response to a request from a client terminal, a server may carry out the aforementioned processing, and may send back the processing result to the client terminal.

Figure 51:
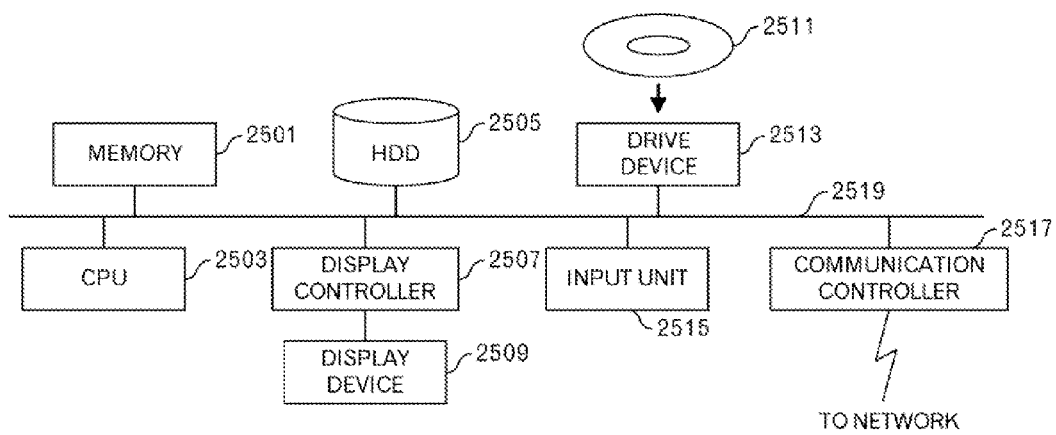
FIG. 51 is a functional block diagram of a computer.

In addition, the aforementioned wiring support apparatus 100 is a computer device as illustrated in FIG. 51. That is, a memory 2501 (storage device), a CPU 2503 (processor), a hard disk drive (HDD) 2505, a display controller 2507 connected to a display device 2509, a drive device 2513 for a removable disk 2511, an input device 2515, and a communication controller 2517 for connection with a network are connected through a bus 2519 as illustrated in FIG. 51. An operating system (OS) and an application program for carrying out the foregoing processing in the embodiment, are stored in the HDD 2505, and when executed by the CPU 2503, they are read out from the HDD 2505 to the memory 2501. As the need arises, the CPU 2503 controls the display controller 2507, the communication controller 2517, and the drive device 2513, and causes them to perform necessary operations. Besides, intermediate processing data is stored in the memory 2501, and if necessary, it is stored in the HDD 2505. In this embodiment of this technique, the application program to realize the aforementioned functions is stored in the computer-readable, non-transitory removable disk 2511 and distributed, and then it is installed into the HDD 2505 from the drive device 2513. It may be installed into the HDD 2505 via the network such as the Internet and the communication controller 2517. In the computer as stated above, the hardware such as the CPU 2503 and the memory 2501, the OS and the necessary application programs systematically cooperate with each other, so that various functions as described above in details are realized.

The aforementioned embodiment is summarized as follows:

A wiring support method for classifying plural signal lines to be wired into plural groups, which relates to the embodiment, includes: (A) accepting, from a user, designation of a condition of grouping plural signal lines to be wired from among a first condition requesting easiness of adjusting lengths of lines, a second condition requesting easiness of wiring, and a third condition requesting the easiness of adjusting the lengths of the lines and the easiness of the wiring and setting priority to either of the easiness of adjusting the lengths of the lines and the easiness of the wiring; and (B) switching and carrying out a grouping of the plural signal lines into plural groups based on the designated condition and a disposition pattern of start terminals and end terminals of the plural signal lines, which are stored in a data storage unit.

Thus, it is possible to appropriately group the signal lines according to the wiring object designated by the user. More specifically, when the single layer wiring is carried out on plural layers, a grouping algorithm is switched according to the disposition pattern of the start terminals and end terminals of the signal lines to be wired and any one designated case of cases including a first case in which the easiness of adjusting the lengths of the lines is requested, a second case in which the easiness of the wiring is requested, a third case in which both of them are requested and the easiness of adjusting the lengths of the lines has priority, and a fourth case in which both of them are requested and the easiness of the wiring has priority.

In addition, the aforementioned switching and carrying out may include: (B1) upon detecting that the designated condition is the second condition or the third condition setting the priority to the easiness of the wiring, carrying out a first grouping processing to ensure the easiness of the wiring; and (B2) upon detecting that the designated condition is the first condition or the third condition setting the priority to the easiness of adjusting the lengths of the lines, carrying out a second grouping processing so as to shorten the maximum length of the signal lines while suppressing a deviation of distribution of lengths of the signal lines among the plurality of groups. When the easiness of adjusting the lengths of the lines is designated or has the priority, it is possible to appropriately group the signal lines while ensuring the easiness of adjusting the lengths of the lines by carrying out the aforementioned grouping processing regardless of the disposition pattern of the start terminals and end terminals of the signal lines to be wired.

Incidentally, the aforementioned disposition pattern may be determined from a first pattern that any one of a first rectangle containing the start terminals and a second rectangle containing the end terminals includes any one of terminals contained in the other rectangle, a second pattern that the first rectangle and the second rectangle do not include any one of terminals contained in the other rectangle and the first rectangle and the second rectangle intersect each other, and a third pattern that the first rectangle and the second rectangle do not include any one of terminals contained in the other rectangle and the first rectangle and the second rectangle do not intersect. In such a case, the aforementioned first grouping processing may include: (B11) in case of the first pattern, carrying out a processing to classify the plural signal lines based on directions of segments connecting the start terminals with the end terminals and intersecting states of the segments; (B12) in case of the second pattern, carrying out a processing to classify the plural signal lines in descending order of a distance from a center of one rectangle whose area is smaller among the first rectangle and the second rectangle to a terminal contained in the other rectangle so as to uniformly disperse the plural signal lines to the plural groups; and (B13) in case of the third pattern, carrying out a processing to classify the plural signal lines so that positions of terminals contained in one rectangle whose area is smaller among the first rectangle and the second rectangle are uniformly dispersed to the plural groups. Because the state of the actual wiring is different according to the disposition pattern, it is preferable that the processing is switched and carried out as described above.

Moreover, the aforementioned wiring support method may include: (C) upon detecting that the designated condition is the third condition, carrying out a processing to exchange a first signal terminal whose length of temporary wired line is the longest when temporary wiring is carried out with a second signal line in a group to be exchanged, wherein the second signal line is selected so that lengths of temporary wired lines and adjacent relationship of terminals of the signal lines in a group containing the first signal terminal and a group containing the second signal line satisfy predetermined conditions (e.g. a condition that the exchange of the signal lines does not badly influence). By carrying out such a processing, the length of the temporary wired line is shortened, and the exchange is carried out so as to reduce the area of the wiring. Therefore, the easiness of the wiring is improved when the easiness of adjusting the lengths of the lines has the priority, and the easiness of adjusting the lengths of the lines is enhanced when the easiness of the wiring has the priority.

Incidentally, it is possible to create a program causing a computer to execute the aforementioned processing, and such a program is stored in a computer readable storage medium or storage device such as a flexible disk, CD-ROM, DVD-ROM, magneto-optic disk, a semiconductor memory, and hard disk. In addition, the intermediate processing result is temporarily stored in a storage device such as a main memory or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A computer-readable, non-transitory storage medium storing a program for causing a computer to execute a process comprising:
   accepting designation of a condition of grouping a plurality of signal lines to be wired from a user; and
   switching and carrying out a grouping of the plurality of signal lines into a plurality of groups based on the designated condition and a disposition pattern of start terminals and end terminals of the plurality of signal lines,
   wherein the condition is designated from a first requirement, a second requirement and a third requirement that includes the first requirement and the second requirement and in which a priority is set to the first requirement or the second requirement, and the first requirement includes a request for easiness of adjusting lengths of lines, and the second requirement includes a request for easiness of wiring, and the switching and carrying out comprises:

upon detecting that the designated condition is the first requirement or the third requirement that includes the first requirement and the second requirement and in which a priority is set to the first requirement, carrying out a first grouping processing to ensure the first requirement; and upon detecting that the designated condition is the second requirement or the third requirement that includes the first requirement and the second requirement and in which a priority is set to the second requirement, carrying out a second grouping processing so as to shorten the maximum length of the signal lines while suppressing a deviation of distribution of lengths of the signal lines among the plurality of groups.

2. The computer-readable, non-transitory storage medium as set forth in claim 1, wherein the disposition pattern is determined from a first pattern that any one of a first rectangle containing the start terminals and a second rectangle containing the end terminals includes any one of terminals contained in the other rectangle, a second pattern that the first rectangle and the second rectangle do not include any one of terminals contained in the other rectangle and the first rectangle and the second rectangle intersect each other, and a third pattern that the first rectangle and the second rectangle do not include any one of terminals contained in the other rectangle and the first rectangle and the second rectangle do not intersect, and the first grouping processing comprises:

in case of the first pattern, carrying out a processing to classify the plurality of signal lines based on directions of segments connecting the start terminals with the end terminals and intersecting states of the segments;

in case of the second pattern, carrying out a processing to classify the plurality of signal lines in descending order of a distance from a center of one rectangle whose area is smaller among the first rectangle and the second rectangle to a terminal contained in the other rectangle so as to uniformly disperse the plurality of signal lines to the plurality of groups; and in case of the third pattern, carrying out a processing to classify the plurality of signal lines so that positions of terminals contained in one rectangle whose area is smaller among the first rectangle and the second rectangle are uniformly dispersed to the plurality of groups.

3. The computer-readable, non-transitory storage medium as set forth in claim 1, wherein the process further comprises:

upon detecting that the designated condition is the third requirement, carrying out a processing to exchange a first signal terminal whose length of temporary wired line is the longest when temporary wiring is carried out with a second signal line in a group to be exchanged, wherein the second signal line is selected so that lengths of temporary wired lines and adjacent relationship of terminals of the signal lines in a group containing the first signal terminal and a group containing the second signal line satisfy predetermined conditions.

4. A method, comprising:

accepting, by using a computer, designation of a condition of grouping a plurality of signal lines to be wired from a user; and switching and carrying out, by using the computer, a grouping of the plurality of signal lines into a plurality of groups based on the designated condition and a disposition pattern of start terminals and end terminals of the plurality of signal lines, wherein the condition is designated from a first requirement, a second requirement and a third requirement that includes the first requirement and the second requirement and in which a priority is set to the first requirement or the second requirement, and the first requirement includes a request for easiness of adjusting lengths of lines, and the second requirement includes a request for easiness of wiring, and the switching and carrying out comprises:

upon detecting that the designated condition is the first requirement or the third requirement that includes the first requirement and the second requirement and in which a priority is set to the first requirement, carrying out a first grouping processing to ensure the first requirement; and upon detecting that the designated condition is the second requirement or the third requirement that includes the first requirement and the second requirement and in which a priority is set to the second requirement, carrying out a second grouping processing so as to shorten the maximum length of the signal lines while suppressing a deviation of distribution of lengths of the signal lines among the plurality of groups.

5. The method as set forth in claim 4, wherein the disposition pattern is determined from a first pattern that any one of a first rectangle containing the start terminals and a second rectangle containing the end terminals includes any one of terminals contained in the other rectangle, a second pattern that the first rectangle and the second rectangle do not include any one of terminals contained in the other rectangle and the first rectangle and the second rectangle intersect each other, and a third pattern that the first rectangle and the second rectangle do not include any one of terminals contained in the other rectangle and the first rectangle and the second rectangle do not intersect, and the first grouping processing comprises:

in case of the first pattern, carrying out a processing to classify the plurality of signal lines based on directions of segments connecting the start terminals with the end terminals and intersecting states of the segments;

in case of the second pattern, carrying out a processing to classify the plurality of signal lines in descending order of a distance from a center of one rectangle whose area is smaller among the first rectangle and the second rectangle to a terminal contained in the other rectangle so as to uniformly disperse the plurality of signal lines to the plurality of groups; and in case of the third pattern, carrying out a processing to classify the plurality of signal lines so that positions of terminals contained in one rectangle whose area is smaller among the first rectangle and the second rectangle are uniformly dispersed to the plurality of groups.

6. The method as set forth in claim 4, further comprising:

upon detecting that the designated condition is the third requirement, carrying out a processing to exchange a first signal terminal whose length of temporary wired line is the longest when temporary wiring is carried out with a second signal line in a group to be exchanged, wherein the second signal line is selected so that lengths of temporary wired lines and adjacent relationship of terminals of the signal lines in a group containing the first signal terminal and a group containing the second signal line satisfy predetermined conditions.

7. An apparatus, comprising:

a memory; and a processor configured to use the memory and execute a process comprising:

accepting designation of a condition of grouping a plurality of signal lines to be wired from a user; and switching and carrying out a grouping of the plurality of signal lines into a plurality of groups based on the designated condition and a disposition pattern of start terminals and end terminals of the plurality of signal lines, wherein the condition is designated from a first requirement, a second requirement and a third requirement that includes the first requirement and the second requirement and in which a priority is set to the first requirement or the second requirement, and the first requirement includes a request for easiness of adjusting lengths of lines, and the second requirement includes a request for easiness of wiring, and the switching and carrying out comprises:

upon detecting that the designated condition is the first requirement or the third requirement that includes the first requirement and the second requirement and in which a priority is set to the first requirement, carrying out a first grouping processing to ensure the first requirement; and upon detecting that the designated condition is the second requirement or the third requirement that includes the first requirement and the second requirement and in which a priority is set to the second requirement, carrying out a second grouping processing so as to shorten the maximum length of the signal lines while suppressing a deviation of distribution of lengths of the signal lines among the plurality of groups.

8. The apparatus as set forth in claim 7, wherein the disposition pattern is determined from a first pattern that any one of a first rectangle containing the start terminals and a second rectangle containing the end terminals includes any one of terminals contained in the other rectangle, a second pattern that the first rectangle and the second rectangle do not include any one of terminals contained in the other rectangle and the first rectangle and the second rectangle intersect each other, and a third pattern that the first rectangle and the second rectangle do not include any one of terminals contained in the other rectangle and the first rectangle and the second rectangle do not intersect, and the first grouping processing comprises:

in case of the first pattern, carrying out a processing to classify the plurality of signal lines based on directions of segments connecting the start terminals with the end terminals and intersecting states of the segments;

in case of the second pattern, carrying out a processing to classify the plurality of signal lines in descending order of a distance from a center of one rectangle whose area is smaller among the first rectangle and the second rectangle to a terminal contained in the other rectangle so as to uniformly disperse the plurality of signal lines to the plurality of groups; and in case of the third pattern, carrying out a processing to classify the plurality of signal lines so that positions of terminals contained in one rectangle whose area is smaller among the first rectangle and the second rectangle are uniformly dispersed to the plurality of groups.

9. The apparatus as set forth in claim 7, wherein the process further comprises:

upon detecting that the designated condition is the third requirement, carrying out a processing to exchange a first signal terminal whose length of temporary wired line is the longest when temporary wiring is carried out with a second signal line in a group to be exchanged, wherein the second signal line is selected so that lengths of temporary wired lines and adjacent relationship of terminals of the signal lines in a group containing the first signal terminal and a group containing the second signal line satisfy predetermined conditions.

\* \* \* \* \*